(12) United States Patent
Paek et al.

(10) Patent No.: US 10,672,699 B2
(45) Date of Patent: Jun. 2, 2020

(54) SEMICONDUCTOR DEVICE WITH REDISTRIBUTION LAYERS ON PARTIAL ENCAPSULATION AND NON-PHOTOSENSITIVE PASSIVATION LAYERS

(71) Applicant: Amkor Technology, Inc., Tempe, AZ (US)

(72) Inventors: Jong Sik Paek, Incheon (KR); Jin Young Kim, Seoul (KR); YoonJoo Kim, Seoul (KR); Jin Han Kim, Gyeonggi-do (KR); SeungJae Lee, Gyeonggi-do (KR); Se Woong Cha, Gyeonggi-do (KR); SungKyu Kim, Seoul (KR); Jae Hun Bae, Seoul (KR); Dong Jin Kim, Gwangju (KR); Doo Hyun Park, Gyeonggi-do (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 16/261,102

(22) Filed: Jan. 29, 2019

(65) Prior Publication Data
US 2019/0229050 A1 Jul. 25, 2019

Related U.S. Application Data

(63) Continuation of application No. 15/812,202, filed on Nov. 14, 2017, now Pat. No. 10,199,322, which is a
(Continued)

(30) Foreign Application Priority Data

Jul. 19, 2013 (KR) ........................ 10-2013-0085629

(51) Int. Cl.
*H01L 23/498* (2006.01)
*H01L 23/00* (2006.01)
(Continued)

(52) U.S. Cl.
CPC .... *H01L 23/49838* (2013.01); *H01L 23/3185* (2013.01); *H01L 23/49816* (2013.01);
(Continued)

(58) Field of Classification Search
CPC .......... H01L 23/3185; H01L 23/49827; H01L 23/49838; H01L 24/03; H01L 2224/02372;
(Continued)

(56) References Cited

U.S. PATENT DOCUMENTS 7,388,294 B2 6/2008 Klein et al.
7,786,577 B2 8/2010 Dangelmaier et al.
(Continued)

*Primary Examiner* — Allan R Wilson
(74) *Attorney, Agent, or Firm* — McAndres, Held & Mallory, Ltd.

(57) ABSTRACT

A semiconductor device with redistribution layers on partial encapsulation is disclosed and may include providing a carrier with a non-photosensitive protection layer, forming a pattern in the non-photosensitive protection layer, providing a semiconductor die with a contact pad on a first surface, and bonding the semiconductor die to the non-photosensitive protection layer such that the contact pad aligns with the pattern formed in the non-photosensitive protection layer. A second surface opposite to the first surface of the semiconductor die, side surfaces between the first and second surfaces of the semiconductor die, and a portion of a first surface of the non-photosensitive protection layer may be encapsulated with an encapsulant. The carrier may be removed leaving the non-photosensitive protection layer bonded to the semiconductor die. A redistribution layer may be formed on the contact pad and a second surface of the non-photosensitive protection layer opposite to the first surface.

19 Claims, 18 Drawing Sheets

Related U.S. Application Data continuation of application No. 15/069,895, filed on Mar. 14, 2016, now Pat. No. 9,818,685, which is a continuation of application No. 14/337,146, filed on Jul. 21, 2014, now Pat. No. 9,287,229.

(51) Int. Cl.
*H01L 23/31* (2006.01)
*H01L 21/56* (2006.01)

(52) U.S. Cl.
CPC ........ *H01L 23/49827* (2013.01); *H01L 24/03* (2013.01); *H01L 24/05* (2013.01); *H01L 24/13* (2013.01); *H01L 21/568* (2013.01); *H01L 23/3114* (2013.01); *H01L 23/3128* (2013.01); *H01L 24/11* (2013.01); *H01L 2224/02317* (2013.01); *H01L 2224/02372* (2013.01); *H01L 2224/0401* (2013.01); *H01L 2224/04105* (2013.01); *H01L 2224/0557* (2013.01); *H01L 2224/05548* (2013.01); *H01L 2224/05568* (2013.01); *H01L 2224/12105* (2013.01); *H01L 2224/13014* (2013.01); *H01L 2224/13017* (2013.01); *H01L 2224/13018* (2013.01); *H01L 2224/13022* (2013.01); *H01L 2224/13024* (2013.01); *H01L 2224/13111* (2013.01); *H01L 2924/12042* (2013.01); *H01L 2924/18162* (2013.01)

(58) Field of Classification Search
CPC ... H01L 2224/05548; H01L 2224/0557; H01L 2224/13022
See application file for complete search history.

(56) References Cited

U.S. PATENT DOCUMENTS

| | | | |
|---|---|---|---|
| 8,309,864 B2 | 11/2012 | Kobayashi et al. | |
| 8,799,845 B2* | 8/2014 | Scanlan | H01L 22/12 716/110 |
| 9,196,509 B2 | 11/2015 | Scanlan et al. | |
| 9,269,658 B2 | 2/2016 | Chen et al. | |
| 9,287,229 B2 | 3/2016 | Paek et al. | |
| 9,818,685 B2 | 11/2017 | Paek et al. | |
| 9,856,136 B2* | 1/2018 | Meyer | H01L 24/19 |
| 9,978,665 B2 | 5/2018 | Marimuthu et al. | |
| 9,978,700 B2 | 5/2018 | Lin | |
| 2004/0145051 A1 | 7/2004 | Klein et al. | |
| 2009/0196011 A1 | 8/2009 | Kobayashi et al. | |
| 2011/0101491 A1 | 5/2011 | Skeete et al. | |
| 2011/0202896 A1* | 8/2011 | Scanlan | H01L 24/19 716/119 |
| 2012/0001339 A1 | 1/2012 | Malatkar | |
| 2012/0068328 A1* | 3/2012 | Chen | H01L 23/13 257/693 |
| 2013/0062761 A1* | 3/2013 | Lin | H01L 23/49816 257/738 |
| 2013/0093097 A1* | 4/2013 | Yu | H01L 25/105 257/774 |
| 2013/0200528 A1 | 8/2013 | Lin et al. | |
| 2013/0228897 A1 | 9/2013 | Chen et al. | |
| 2014/0103527 A1 | 4/2014 | Marimuthu et al. | |
| 2014/0110856 A1* | 4/2014 | Lin | H01L 24/19 257/774 |
| 2014/0183718 A1 | 7/2014 | Han et al. | |
| 2014/0264808 A1* | 9/2014 | Wolter | H01L 25/0657 257/678 |

\* cited by examiner

SEMICONDUCTOR DEVICE WITH REDISTRIBUTION LAYERS ON PARTIAL ENCAPSULATION AND NON-PHOTOSENSITIVE PASSIVATION LAYERS

CROSS-REFERENCE TO RELATED APPLICATIONS

This application is a continuation of application Ser. No. 15/812,202, filed on Nov. 14, 2017, which is a continuation of application Ser. No. 15/069,895, filed on Mar. 14, 2016, now U.S. Pat. No. 9,818,685, which is a continuation of application Ser. No. 14/337,146, filed on Jul. 21, 2014, now U.S. Pat. No. 9,287,229, which makes reference to, claims priority to, and claims the benefit of Korean Patent Application No. 10-2013-0085629, filed on Jul. 19, 2013. Each of the above stated applications is hereby incorporated herein by reference in their entirety.

FIELD

Certain embodiments of the disclosure relate to semiconductor chip packaging. More specifically, certain embodiments of the disclosure relate to a semiconductor device with redistribution layers on partial encapsulation and non-photosensitive passivation layers.

BACKGROUND

In general, a semiconductor device includes a semiconductor die fabricated by fabricating a wafer and forming an integrated circuit (IC) on the wafer. The semiconductor device includes a redistribution layer, a conductive bump, etc. for redistributing circuits and wirings. In addition, the semiconductor device may further include a protection layer for electrically disconnecting the redistribution layer from the semiconductor die and fixing the conductive bump. In the semiconductor device, a photolithography process is used in forming the redistribution layer and the protection layer. Since photoresist coating, exposing and developing steps are involved in the photolithography process, the manufacturing process may become complicated. In addition, since the number of masks used in the process increases, which lowers the yield, resulting in an increase in the manufacturing cost.

Further limitations and disadvantages of conventional and traditional approaches will become apparent to one of skill in the art, through comparison of such systems with the present disclosure as set forth in the remainder of the present application with reference to the drawings.

BRIEF SUMMARY

A semiconductor device with redistribution layers on partial encapsulation and non-photosensitive passivation layers, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1:
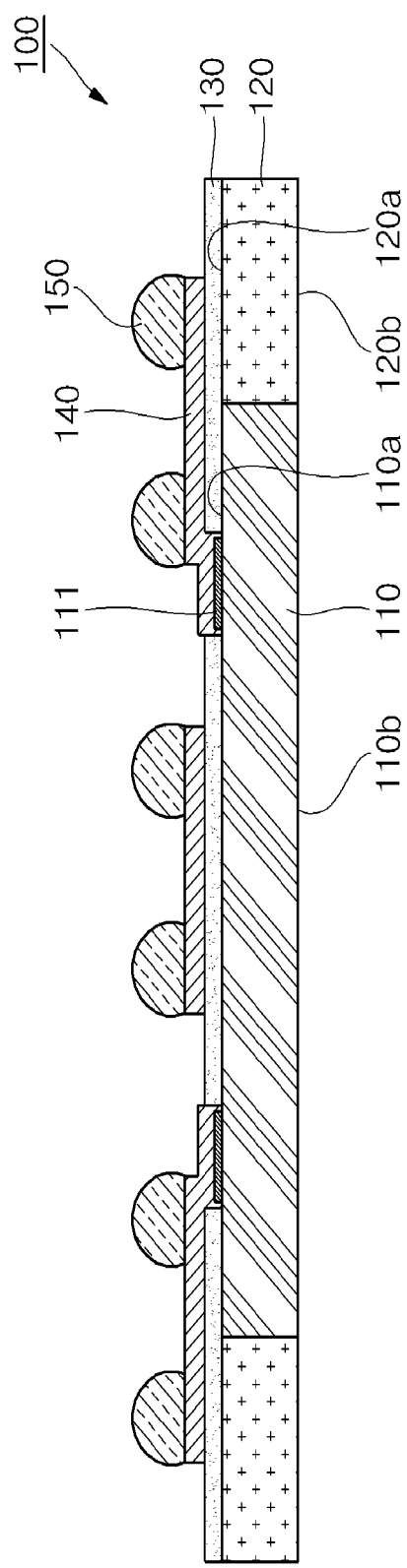
FIG. 1 is a cross-sectional view of a semiconductor device according to an embodiment of the present disclosure.

Certain aspects of the disclosure may be found in providing a carrier with a non-photosensitive protection layer, forming a pattern in the non-photosensitive protection layer, providing a semiconductor die with a contact pad on a first surface, and bonding the semiconductor die to the non-photosensitive protection layer such that the contact pad aligns with the pattern formed in the non-photosensitive protection layer. A second surface opposite to the first surface of the semiconductor die, side surfaces between the first and second surfaces of the semiconductor die, and a portion of a first surface of the non-photosensitive protection layer may be encapsulated with an encapsulant. The carrier may be removed leaving the non-photosensitive protection layer bonded to the semiconductor die. A redistribution layer may be formed on the contact pad and a second surface of the non-photosensitive protection layer opposite to the first surface. A conductive bump may be formed on the redistribution layer. The encapsulant may be thinned such that the second surface of the semiconductor die is coplanar with the encapsulant. A through via may be formed from the redistribution layer through the non-photosensitive protection layer and the encapsulant. At least a portion of the through via may be filled with conductive material. The non-photosensitive protective layer may be patterned utilizing a laser.

Various aspects of the present disclosure may be embodied in many different forms and should not be construed as being limited to the example embodiments set forth herein. Rather, these example embodiments of the disclosure are provided so that this disclosure will be thorough and complete and will fully convey various aspects of the disclosure to those skilled in the art.

In the drawings, the thickness of layers and regions are exaggerated for clarity. Here, like reference numerals refer to like elements throughout. As used herein, the term "and/or" includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises" and/or "comprising," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Referring to FIG. 1, a cross-sectional view of a semiconductor device according to an embodiment of the present disclosure is illustrated.

As illustrated in FIG. 1, the semiconductor device 100 may comprise a semiconductor die 110 having a plurality of bond pads 111 formed thereon, a first encapsulant 120 encapsulating side portions of the semiconductor die 110, a non-photosensitive protection layer 130 formed on the semiconductor die 100 and the first encapsulant 120, at least one redistribution layer 140 formed on the non-photosensitive protection layer 130, and a conductive bump 150 connected to the redistribution layer 140.

The semiconductor die 110 may be substantially panel-shaped having a planar first surface 110a and a second surface 110b opposite to the first surface 110a, and may comprise a plurality of bond pads 111 formed on the first surface 110a. The plurality of bond pads 111 of the semiconductor die 110 may be electrically connected to the redistribution layer 140. The semiconductor die 110 may further comprise a passivation layer (not shown) formed to cover the first surface 110a having the plurality of bond pads 111 and exposing some of the plurality of bond pads 111 to the outside. The first surface 110a of the semiconductor die 110 may be covered by the non-photosensitive protection layer 130, and the plurality of bond pads 111 may be exposed to the outside through the non-photosensitive protection layer 130 to then be brought into contact with the redistribution layer 140. The semiconductor die 110 may comprise a general silicon semiconductor, a compound semiconductor, and equivalents thereof, but not limited thereto.

The first encapsulant 120 may be formed to encapsulate side portions of the semiconductor die 110. That is to say, the first encapsulant 120 may be formed to encapsulate the side portions between the first surface 110a and the second surface 110b of the semiconductor die 110 and protects the semiconductor die 110 from the external environment. The first encapsulant 120 may comprise a planar first surface 120a coplanar with the first surface 110a of the semiconductor die 110 and a second surface 120b opposite to the first surface 120a. Here, the second surface 120b of the first encapsulant 120 may be coplanar with the second surface 110b of the semiconductor die 110. The first surface 120a of the first encapsulant 120 may be covered by the non-photosensitive protection layer 130. The first encapsulant 120 may comprise an epoxy-based resin that is an electrically insulating material.

The non-photosensitive protection layer 130 may be formed to cover both of the first surface 110a of the semiconductor die 110 and the first surface 120a of the first encapsulant 120 and allows the plurality of bond pads 111 to be exposed to the outside. That is to say, the non-photosensitive protection layer 130 may comprise a pattern exposing the plurality of bond pads 111 to the outside and may be formed to cover the first surface 110a of the semiconductor die 110 and the first surface 120a of the first encapsulant 120. The exposed plurality of bond pads 111 may be electrically connected to the redistribution layer 140. The non-photosensitive protection layer 130 may electrically protect the semiconductor die 110. The non-photosensitive protection layer 130 may be an insulating film formed by printing, spin coating, or an equivalent thereof. The non-photosensitive protection layer 130 may comprise a non-photosensitive insulating film and may be patterned by laser without use of a photolithography process. The non-photosensitive protection layer 130 may be interposed between the redistribution layer 140 and the semiconductor die 110 or between the redistribution layer 140 and the first encapsulant 120 and electrically isolate the redistribution layer 140 from the first surface 110a of the semiconductor die 110 while protecting the first surface 110a of the semiconductor die 110 from the external environment.

The redistribution layer 140 may be formed on the non-photosensitive protection layer 130 to make contact with the plurality of bond pads 111 exposed to the outside through the non-photosensitive protection layer 130. The redistribution layer 140 may be connected to the plurality of bond pads 111 to then be electrically connected. The redistribution layer 140 may have various patterns so as to make contact with each of the plurality of bond pads 111 and one or more redistribution layers 140 may be provided. The one or more redistribution layers 140 may extend to the non-photosensitive protection layer 130 formed on the first surface 120a of the first encapsulant 120. The redistribution layers 140 may be formed on the non-photosensitive protection layer 130 formed on the first surface 110a of the semiconductor die 110 and at least one of the redistribution layers 140 may extend from the non-photosensitive protection layer 130 formed on the first surface 110a of the semiconductor die 110 to the non-photosensitive protection layer 130 formed on the first surface 120a of the first encapsulant 120.

Figure 2A:
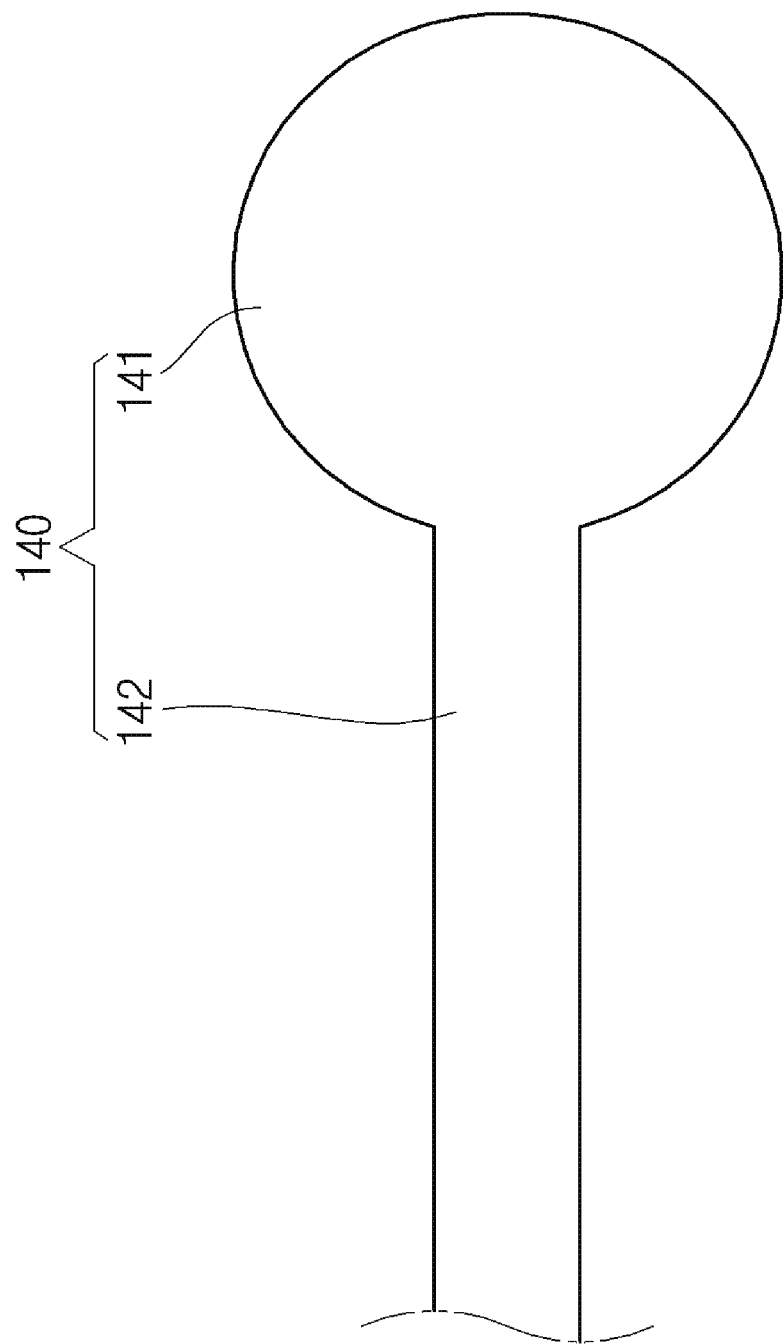
FIGS. 2A-2C show an enlarged cross-sectional view and a plan view of a conductive bump shown in FIG. 1.

A plan view of the redistribution layer 140 is illustrated in FIG. 2A. The redistribution layer 140 may include input/output pads 141 for forming the conductive bump 150 and a connecting part 142 connecting the pad 141 and the plurality of bond pads 111. The input/output pads 141 may be substantially circular and may be formed on the non-photosensitive protection layer 130. The connecting part 142 may be shaped as a line having a predetermined width smaller than a diameter of the input/output pads 141.

The redistribution layer 140 may be formed for the purpose of changing positions of the plurality of bond pads 111 of the semiconductor die 110 or changing the number of input/output pads 141. The redistribution layer 140 may be formed by a photolithography process.

Figure 2B:
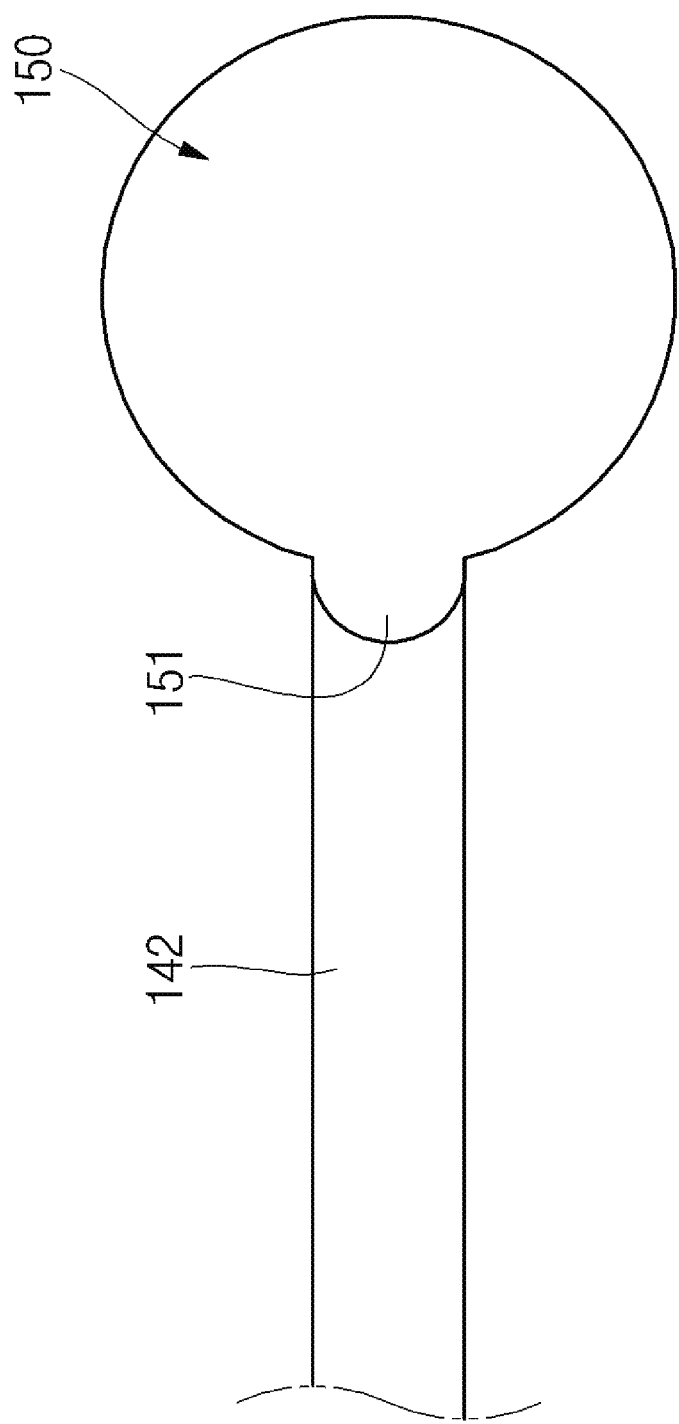
Figure 2C:
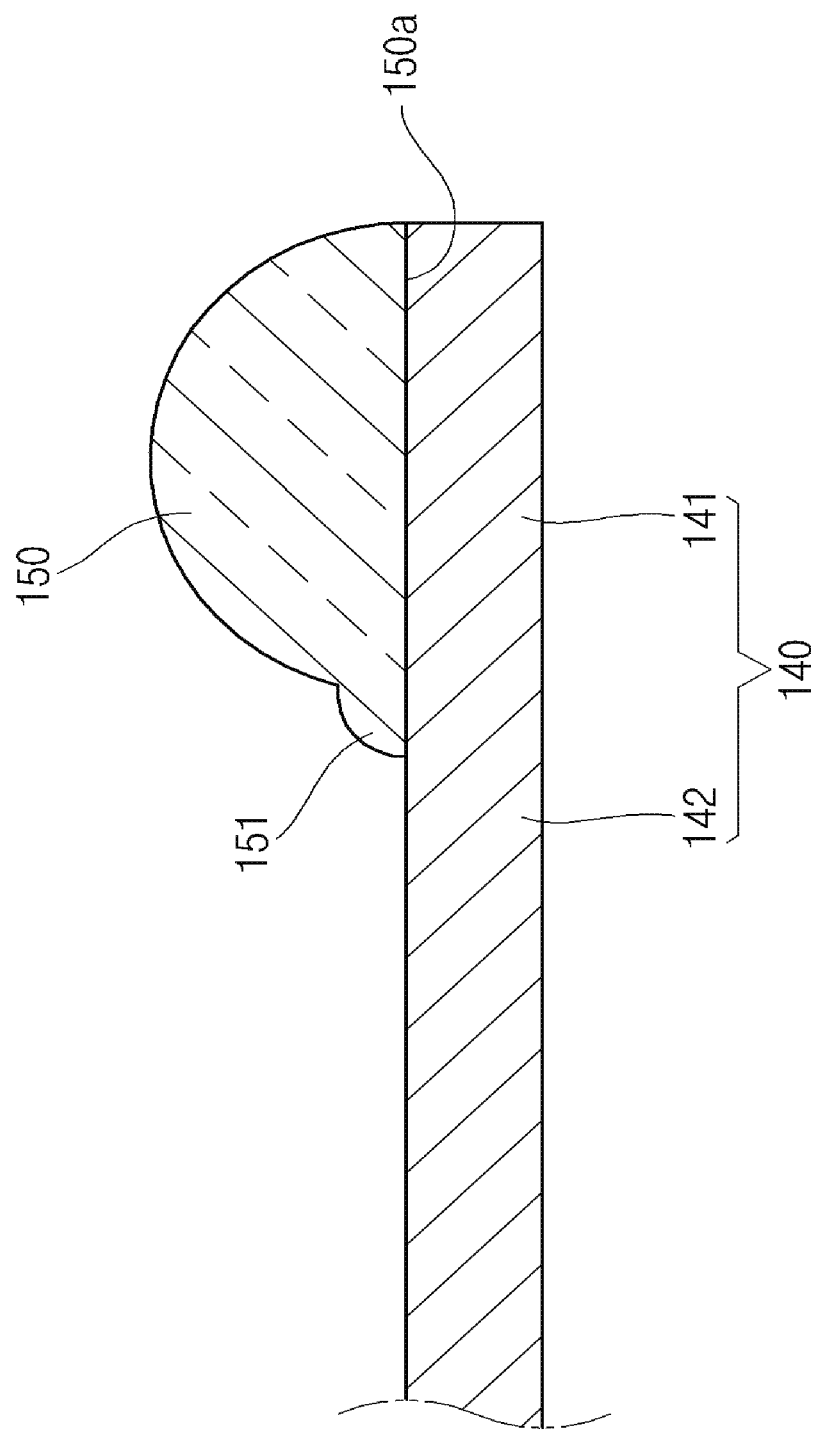

The conductive bump 150 may be formed to make contact with the redistribution layer 140. The conductive bump 150 may be formed on the pad 141 of the redistribution layer 140. The conductive bump 150 may be electrically connected to the plurality of bond pads 111 of the semiconductor die 110 through the redistribution layer 140. A plan view of the redistribution layer 140 having the conductive bump 150 is illustrated in FIG. 2B, and an enlarged cross-sectional view thereof is illustrated in FIG. 2C.

The conductive bump 150 may be hemisphere-shaped where one surface 150a may be connected to the pad 141 of the redistribution layer 140. Here, the conductive bump 150 further comprises a protruding part 151 protruding to the connecting part 142 of the distribution layer 140. That is to say, the conductive bump 150 may be formed directly on the pad 141 of the redistribution layer 140 without a separate protection layer and the protruding part 151 may be formed when a portion of the conductive bump 150 flows toward the connecting part 142. Here, since a curvature radius of the conductive bump 150 formed on the pad 141 is much larger than that of the protruding part 151, the same surface tension may be applied to the conductive bump 150 and the protruding part 151 in a case where the conductive bump 150 and the protruding part 151 comprise the same material. Thus, the conductive bump 150 formed on the pad 141 may have a much smaller pressure than the protruding part 151, thereby preventing the conductive bump 150 from excessively spreading toward the connecting part 142. That is to say, the conductive bump 150 may be directly formed on the pad 141 of the redistribution layer 140 without using a separate protection layer. The conductive bump 150 may be a solder bump, and may comprise a material selected from a eutectic solder (e.g., Sn37Pb), a high lead solder (e.g., Sn95Pb), a lead-free solder (e.g., SnAg, SnAu, SnCu, SnZn, SnZnBi, SnAgCu, or SnAgBi), but not limited thereto.

Figure 3:
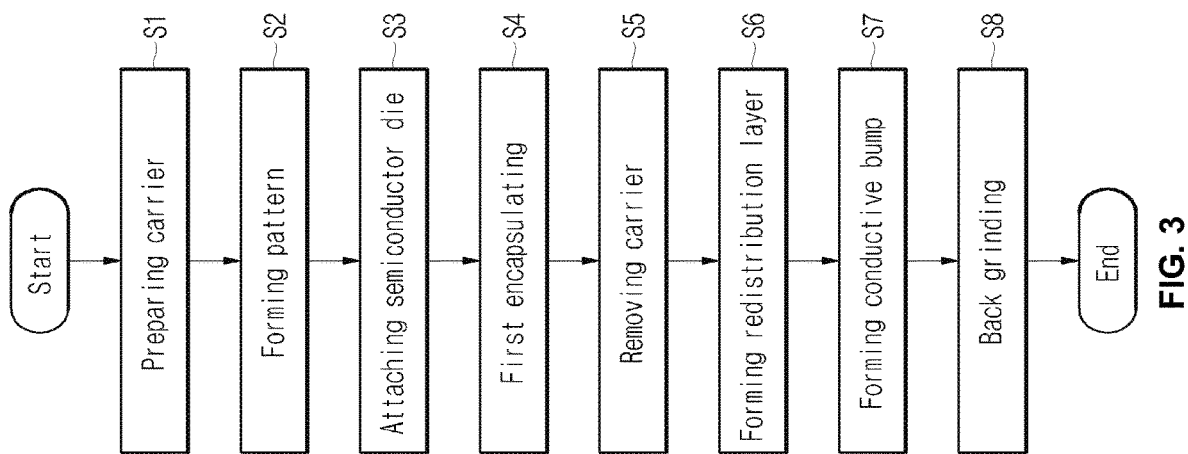
FIG. 3 is a flowchart illustrating a manufacturing method of the semiconductor device shown in FIG. 1.

Referring to FIG. 3, a flowchart illustrating a manufacturing method of the semiconductor device shown in FIG. 1 is illustrated.

As illustrated in FIG. 3, the manufacturing method of the semiconductor device 100 includes (S1) preparing a carrier, (S2) forming a pattern, (S3) attaching a semiconductor die, (S4) first encapsulating, (S5) removing the carrier, (S6) forming a redistribution layer, (S7) forming a conductive bump, and (S8) back grinding.

The manufacturing method of the semiconductor device 100 will now be described in more detail with reference to FIGS. 4A to 4H.

Figures 4A, 4B:
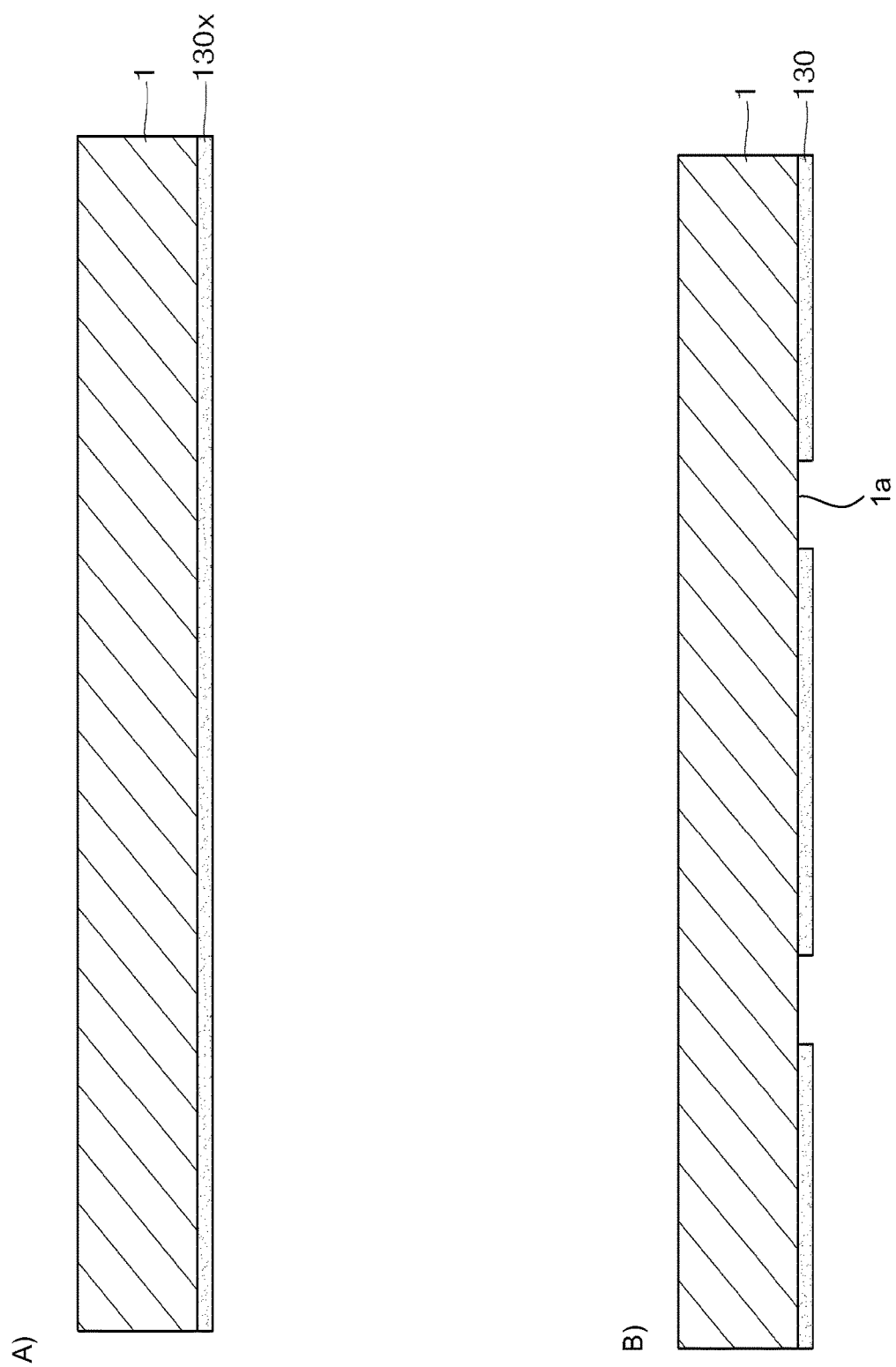
FIGS. 4A to 4H are cross-sectional views illustrating a manufacturing method of the semiconductor device shown in FIG. 3.

Referring to FIG. 4A, a cross-sectional view illustrating the step of preparing a carrier (S1) in the manufacturing method of the semiconductor device 100 is illustrated. In the preparing of the carrier step (S1), a carrier 1 having a non-photosensitive protection layer 130x may be prepared to cover one surface 1a of the carrier 1. The non-photosensitive protection layer 130x may comprise an insulating film having a predetermined thickness, formed on the one plane 1a of the carrier 1 by printing, spin coating, or an equivalent thereof. The non-photosensitive protection layer 130x may be temporarily adhered to the carrier 1 using an adhesive (not shown).

Referring to FIG. 4B, a cross-sectional view illustrating the step of forming a pattern (S2) in the manufacturing method of the semiconductor device 100 is illustrated. In the forming of the pattern step (S2), the non-photosensitive protection layer 130x formed on the one plane 1a of the carrier 1 may be patterned by laser to expose a portion of the one plane 1a of the carrier 1 to the outside. That is to say, the non-photosensitive protection layer 130 is a non-photosensitive insulating film that can be patterned by laser without using a photolithography process. The non-photosensitive protection layer 130 may be patterned to expose the one plane 1a of the carrier 1 facing a region of the semiconductor die 110 where the bond pads 111 are formed.

Figures 4C, 4D:
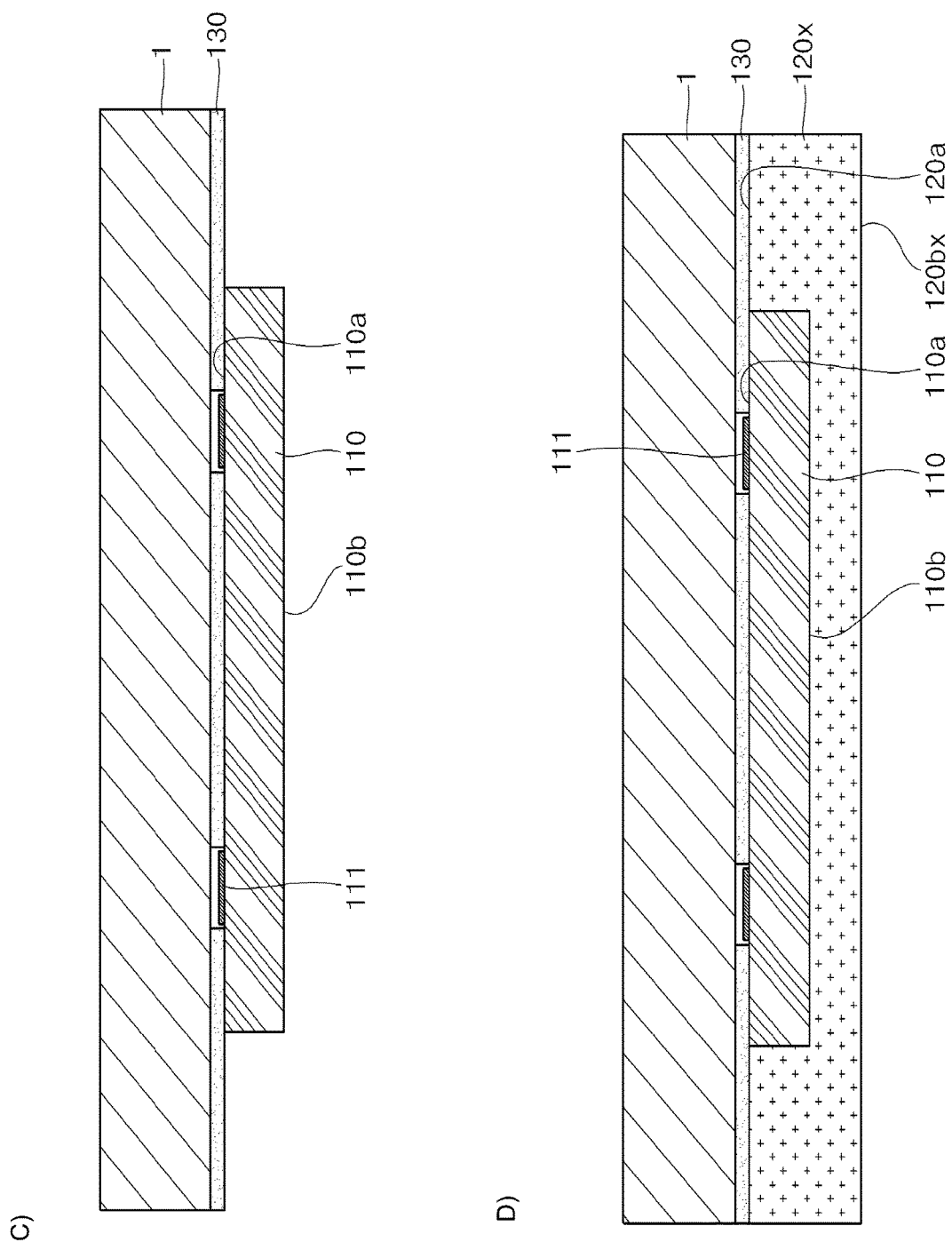

Referring to FIG. 4C, a cross-sectional view illustrating the step of attaching a semiconductor die (S3) in the manufacturing method of the semiconductor device 100 is illustrated. In the attaching of the semiconductor die step (S3), the semiconductor die 110 may be mounted on the carrier 1 having the non-photosensitive protection layer 130 to allow the one plane 1a of the carrier 1 exposed to the outside by the non-photosensitive protection layer 130 and the plurality of bond pads 111 of the semiconductor die 110 to face each other. That is to say, the first surface 110a of the semiconductor die 110 having the plurality of bond pads 111 formed thereon may be adhered to the non-photosensitive protection layer 130. Here, the plane of the semiconductor die 110 may be smaller than that of the non-photosensitive protection layer 130, thereby allowing an outer portion of the non-photosensitive protection layer 130 to be exposed to the outside.

Referring to FIG. 4D, a cross-sectional view illustrating the step of first encapsulating (S4) in the manufacturing method of the semiconductor device 100 is illustrated. In the first encapsulating (S4), the first encapsulant 120x may be formed to encapsulate the second surface 110b opposite to the first surface 110a of the semiconductor die 110 and a side surface connecting the first surface 110a and the second surface 110b. Here, the first encapsulant 120x may be formed to cover the non-photosensitive protection layer 130 exposed to the outside in the attaching of the semiconductor die (S3). The first encapsulant 120x may protect the second surface 110b and the side surface of the semiconductor die 110 from the external environment in subsequent processes. The first encapsulant 120x may serve as a carrier for fixing the semiconductor die 110 when transferred to equipment for each process and preventing the semiconductor die 110 from being damaged in the subsequent processes. In the first encapsulating (S4), after the forming of the first encapsulant 120x, the first encapsulant 120x may be cured by heat treatment.

Figures 4E, 4F:
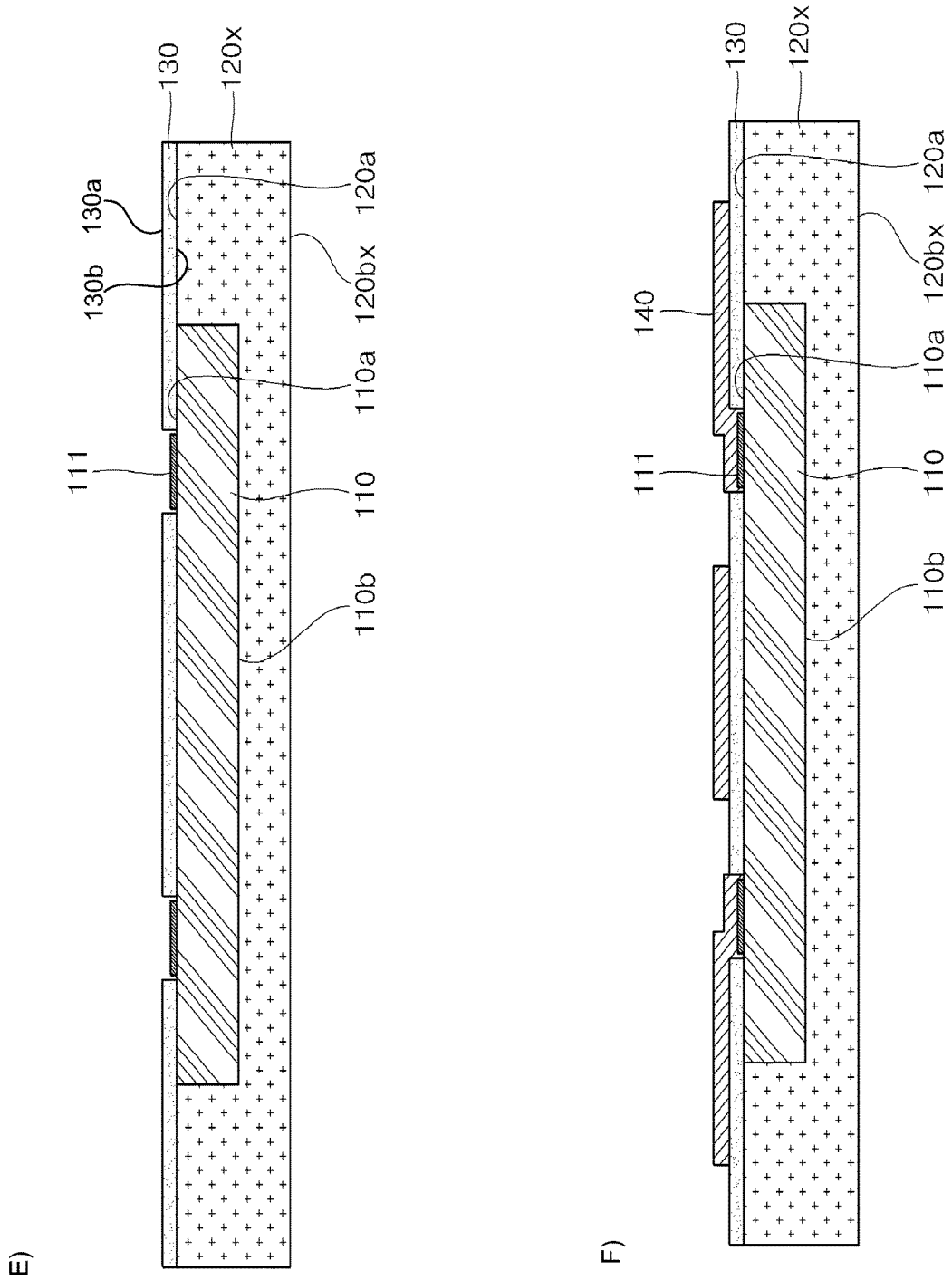

Referring to FIG. 4E, a cross-sectional view illustrating the step of removing the carrier (S5) in the manufacturing method of the semiconductor device 100 is illustrated. In the removing of the carrier (S5), the carrier 1 temporarily adhered to the non-photosensitive protection layer 130 may be separated and then removed. The carrier 1 may be removed by reducing an adhering strength by applying a predetermined stimulus to the adhesive applied to the non-photosensitive protection layer 130 and then separating the carrier 1 from the non-photosensitive protection layer 130. The adhering strength of the adhesive between the carrier 1 and the non-photosensitive protection layer 130 may be reduced by heat treatment performed to curing the first encapsulant 120x in the first encapsulating (S4), but aspects of the present disclosure are not limited thereto. Here, as the carrier 1 adhered to the non-photosensitive protection layer 130 is separated therefrom and removed in the removing of the carrier (S5), a first surface 130a of the non-photosensitive protection layer 130 opposite to a second surface 130b that may be in contact with the semiconductor die 110, may be exposed to the outside. In addition, the plurality of bond pads 111 of the semiconductor die 110 facing the carrier 1 may be exposed to the outside as the result of removing the carrier 1.

Referring to FIG. 4F, a cross-sectional view illustrating the step of forming the redistribution layer (S6) in the manufacturing method of the semiconductor device 100 is illustrated. In the forming the redistribution layer step (S6), one or more redistribution layers 140 may be formed on the first surface 130a of the non-photosensitive protection layer 130 to be brought into contact with the plurality of bond pads 111. The redistribution layers 140 may be electrically connected to the plurality of bond pads 111 of the semiconductor die 110. At least one of the redistribution layers 140 may extend to the first surface 130a of the non-photosensitive protection layer 130 formed on the first surface 120a of the first encapsulant 120x.

Figures 4G, 4H:
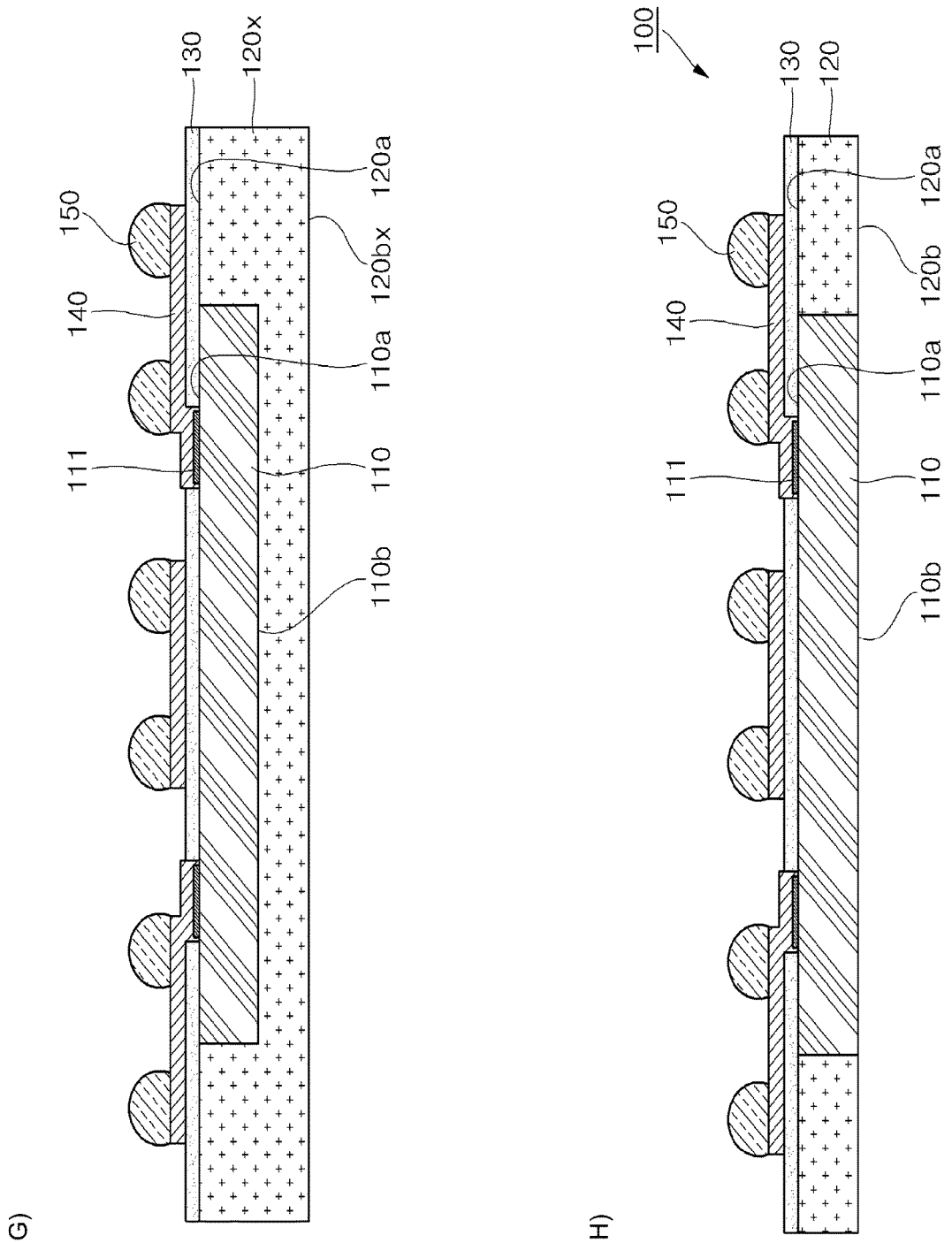

Referring to FIG. 4G, a cross-sectional view illustrating the step of forming a conductive bump (S7) in the manufacturing method of the semiconductor device 100 is illustrated. In the forming of the conductive bump step (S7), the conductive bump 150 may be formed on the redistribution layer 140. The conductive bump 150 may be electrically connected to the redistribution layer 140. The conductive bump 150 may be electrically connected to the redistribution layer 140 through the redistribution layer 140 and the bond pads 111.

Referring to FIG. 4H, a cross-sectional view illustrating the step of back grinding (S8) in the manufacturing method of the semiconductor device 100 is illustrated. In the back grinding step (S8), the first encapsulant 120x may be thinned to expose the second surface 110b of the semiconductor die 110 encapsulated by the first encapsulant 120x to the outside. That is to say, in the back grinding (S8), a second surface 120bx of the first encapsulant 120x is subjected to grinding to expose the second surface 110b of the semiconductor die 110, thereby allowing only side portions of the semiconductor die 110 to be encapsulated by the first encapsulant 120. Here, the first surface 110a of the semiconductor die 110 and the first surface 120a of the first encapsulant 120 may be coplanar with respect to each other, and the second surface 110b of the semiconductor die 110 and the second surface 120b of the first encapsulant 120 may be coplanar with respect to each other.

Figure 5:
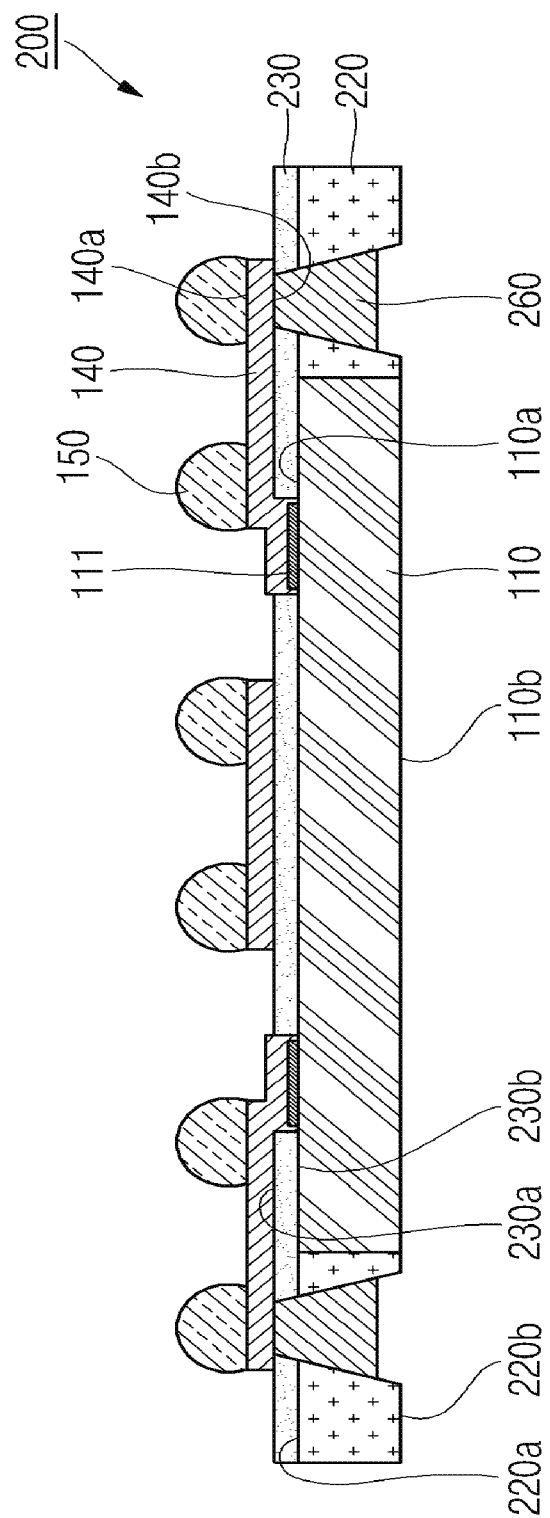
FIG. 5 is a cross-sectional view of a semiconductor device according to another embodiment of the present disclosure.

Referring to FIG. 5, a cross-sectional view of a semiconductor device according to another embodiment of the present disclosure is illustrated.

As illustrated in FIG. 5, the semiconductor device 200 may comprise a semiconductor die 110 having a plurality of bond pads 111 formed thereon, a first encapsulant 220 encapsulating side portions of the semiconductor die 110, a non-photosensitive protection layer 230 formed on the semiconductor die 200 and the first encapsulant 220, at least one redistribution layer 140 formed on the non-photosensitive protection layer 230, a conductive bump 150 connected to the redistribution layer 140, and a conductive connection member 260 electrically connected to the redistribution layer 140. The semiconductor die 110, the redistribution layer 140 and the conductive bump 150 of the semiconductor device 200 may be substantially similar to the corresponding components of the semiconductor device 100 shown in FIG. 1. Therefore, the following description will focus on the first encapsulant 220, the non-photosensitive protection layer 230 and the conductive connection member 260 of the semiconductor device 200, which may be different from the corresponding components of the semiconductor device 100 shown in FIG. 1.

The first encapsulant 220 may be formed to encapsulate side portions of the semiconductor die 110. That is to say, the first encapsulant 220 may be formed to encapsulate the side portions between the first surface 110a and the second surface 110b of the semiconductor die 110 and protects the semiconductor die 110 from external circumstances. The first encapsulant 220 has a planar first surface 220a coplanar with the first surface 110a of the semiconductor die 110 and a second surface 220b opposite to the first surface 220a. Here, the second surface 220b of the first encapsulant 220 may be coplanar with the second surface 110b of the semiconductor die 110. The first surface 220a of the first encapsulant 220 may be covered by the non-photosensitive protection layer 230. A through-via may be formed in the first encapsulant 220 to pass through between the first surface 220a and the second surface 220b, and the conductive connection member 260 may be formed in the through-via to fill the through-via. The first encapsulant 220 may comprise an epoxy-based resin that is an electrically insulating material.

The non-photosensitive protection layer 230 may be formed to cover both of the first surface 110a of the semiconductor die 110 and the first surface 220a of the first encapsulant 220 and allows the plurality of bond pads 111 to be exposed to the outside. That is to say, the non-photosensitive protection layer 230 may comprise a pattern exposing the plurality of bond pads 111 to the outside and may be formed to cover the first surface 110a of the semiconductor die 110 and the first surface 220a of the first encapsulant 220. The exposed plurality of bond pads 111 may be electrically connected to the redistribution layer 140. A second surface 230b of the non-photosensitive protection layer 230 may be brought into contact with the first surface 110a of the semiconductor die 110 and with the first surface 220a of the first encapsulant 220.

The conductive connection member 260 passing through between the first surface 220a and the second surface 220b of the first encapsulant 220 may also pass through between the first surface 230a and the second surface 230b of the non-photosensitive protection layer 230. That is to say, the conductive connection member 260 may pass through the first encapsulant 220 and the non-photosensitive protection layer 230 to then be brought into contact with the redistribution layer 140 formed on the first surface 230a of the non-photosensitive protection layer 230.

The non-photosensitive protection layer 230 may electrically protect the semiconductor die 110. The non-photosensitive protection layer 230 may be an insulating film formed by printing, spin coating, or an equivalent thereof. The non-photosensitive protection layer 230 may comprise a non-photosensitive insulating film and may be patterned by laser without use of a photolithography process. The non-photosensitive protection layer 230 may be interposed between the redistribution layer 140 and the semiconductor die 110 and/or between the redistribution layer 140 and the first encapsulant 220 and may electrically isolate the redistribution layer 140 from the first surface 110a of the semiconductor die 110 while protecting the first surface 110a of the semiconductor die 110 from the external environment.

The conductive connection member 260 may be formed to pass through between the first surface 220a and the second surface 220b of the first encapsulant 220 and between the first surface 230a and the second surface 230b of the non-photosensitive protection layer 230. The conductive connection member 260 may be connected to the redistribution layer 140 formed on the first surface 230a of the non-photosensitive protection layer 230. That is to say, the conductive connection member 260 may be connected to the second surface 140b opposite to the first surface 140a of the redistribution layer 140 connected to the conductive bump 150. The conductive connection member 260 may be electrically connected to the semiconductor die 110 through the redistribution layer 140 and the bond pads 111. The conductive connection member 260 may comprise the same material with the conductive bump 150, but aspects of the present disclosure are not limited thereto.

Figure 6:
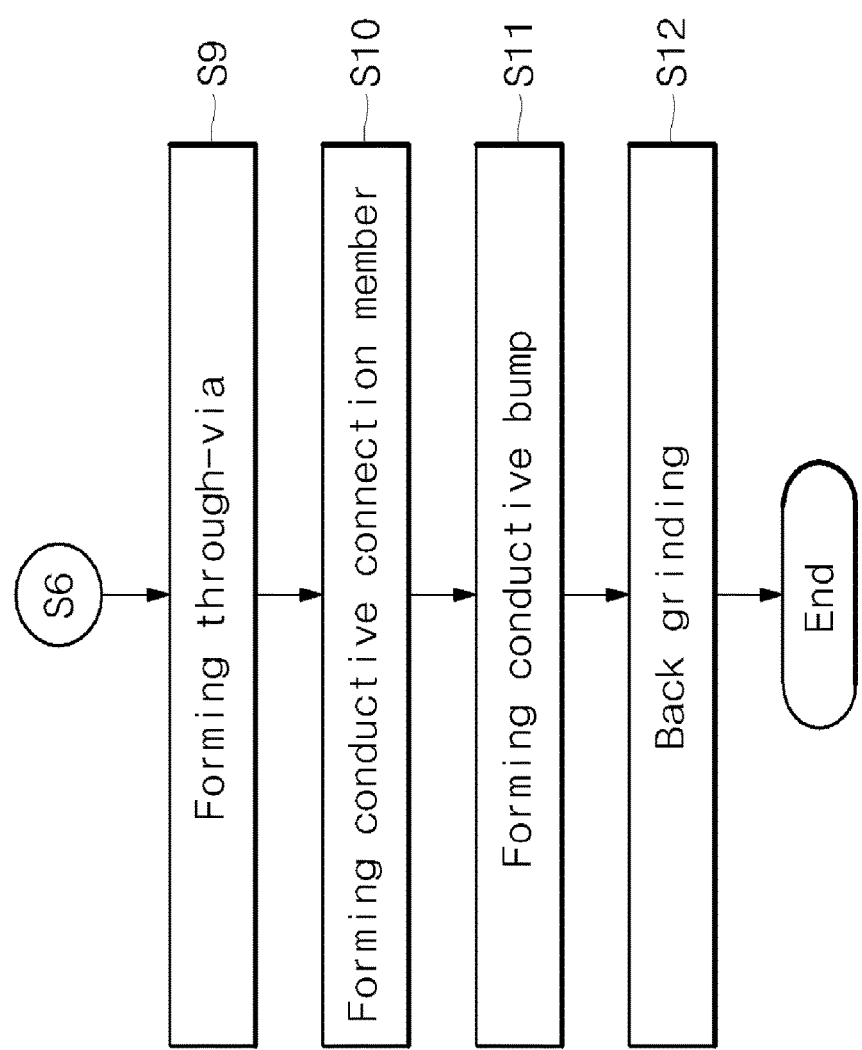
FIG. 6 is a flowchart illustrating a manufacturing method of the semiconductor device shown in FIG. 5.

Referring to FIG. 6, a flowchart illustrating a manufacturing method of the semiconductor device shown in FIG. 5 is illustrated.

As illustrated in FIG. 6, the manufacturing method of the semiconductor device 200 comprises several steps preceded by (S1) preparing a carrier, (S2) forming a pattern, (S3) attaching a semiconductor die, (S4) first encapsulating, (S5) removing the carrier, and (S6) forming a redistribution layer, and only the steps performed after the steps (S1) to (S6) are illustrated. That is to say, the following description will focus on forming a through-via (S9), forming a conductive connection member (S10), forming a conductive bump (S11) and back grinding (S12), which are different from the corresponding processing steps of the manufacturing method shown in FIG. 3. Therefore, the manufacturing method of the semiconductor device 200 will be described in more detail with reference to FIGS. 7A to 7D.

Figures 7A, 7B:
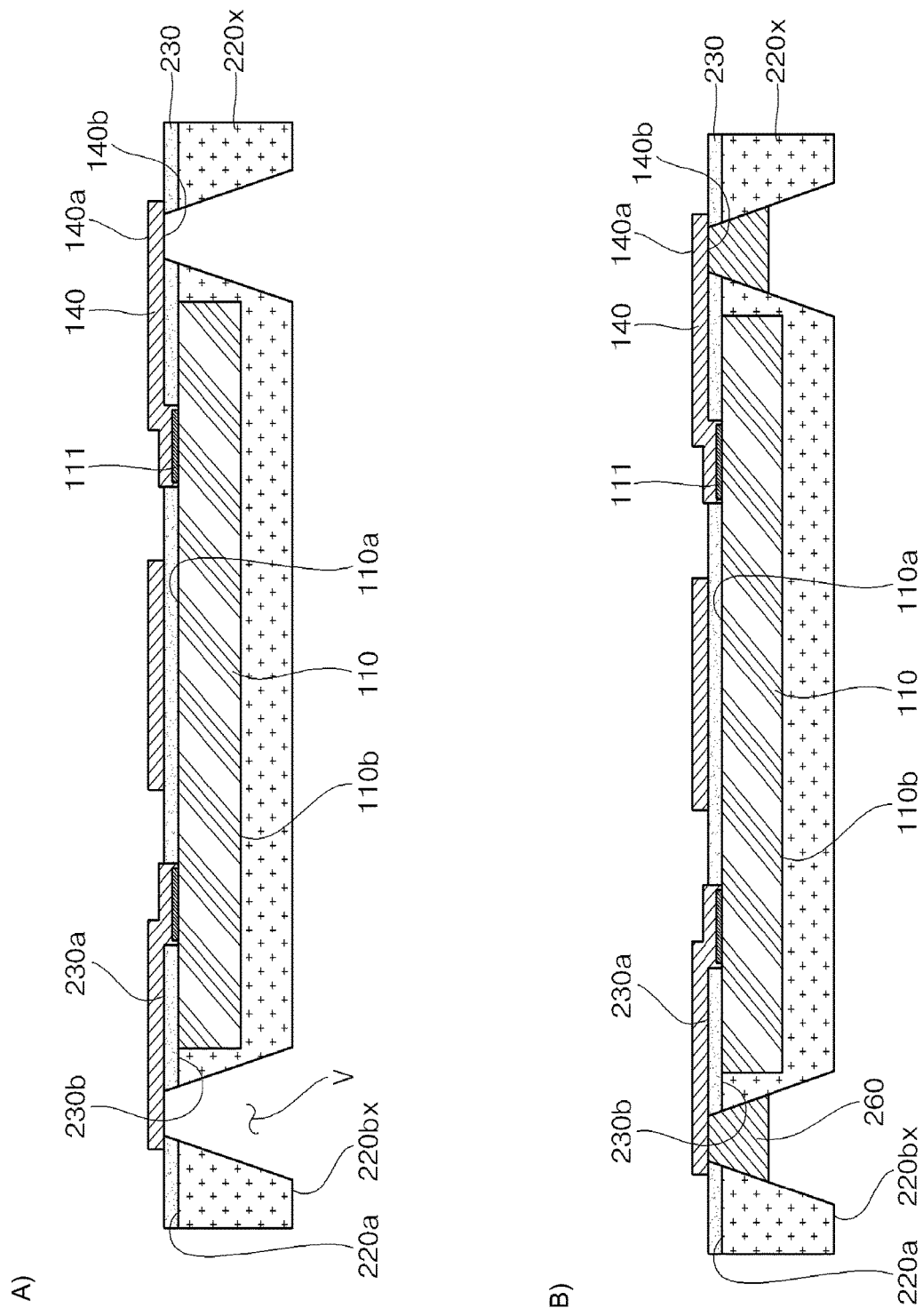
FIGS. 7A to 7D are cross-sectional views illustrating a manufacturing method of the semiconductor device shown in FIG. 6.

Referring to FIG. 7A, a cross-sectional view illustrating the step of forming a through-via (S9) in the manufacturing method of the semiconductor device 200 is illustrated. In the forming of the through-via (S9), a through-via (V) passing through between the first surface 220a and the second surface 220bx of the first encapsulant 220x and between the first surface 230a and the second surface 230b of the non-photosensitive protection layer 230 to expose the second surface 140b of the redistribution layer 140 formed on the first surface 230a of the non-photosensitive protection layer 230 to the outside. That is to say, the second surface 140b of the redistribution layer 140 formed on the first surface 230a of the non-photosensitive protection layer 230 is exposed to the second surface 200bx of the first encapsulant 220 through the through-via v.

Referring to FIG. 7B, a cross-sectional view illustrating the step of forming a conductive connection member (S10) in the manufacturing method of the semiconductor device 200 is illustrated. In the forming of the conductive connection member step (S10), the conductive connection member 260 may be formed to fill the through-via (V) formed in the first encapsulant 220x and the non-photosensitive protection layer 230. The conductive connection member 260 may make contact with the second surface 140b of the redistribution layer 140. That is to say, the conductive connection member 260 may be electrically connected to the redistribution layer 140.

Figures 7C, 7D:
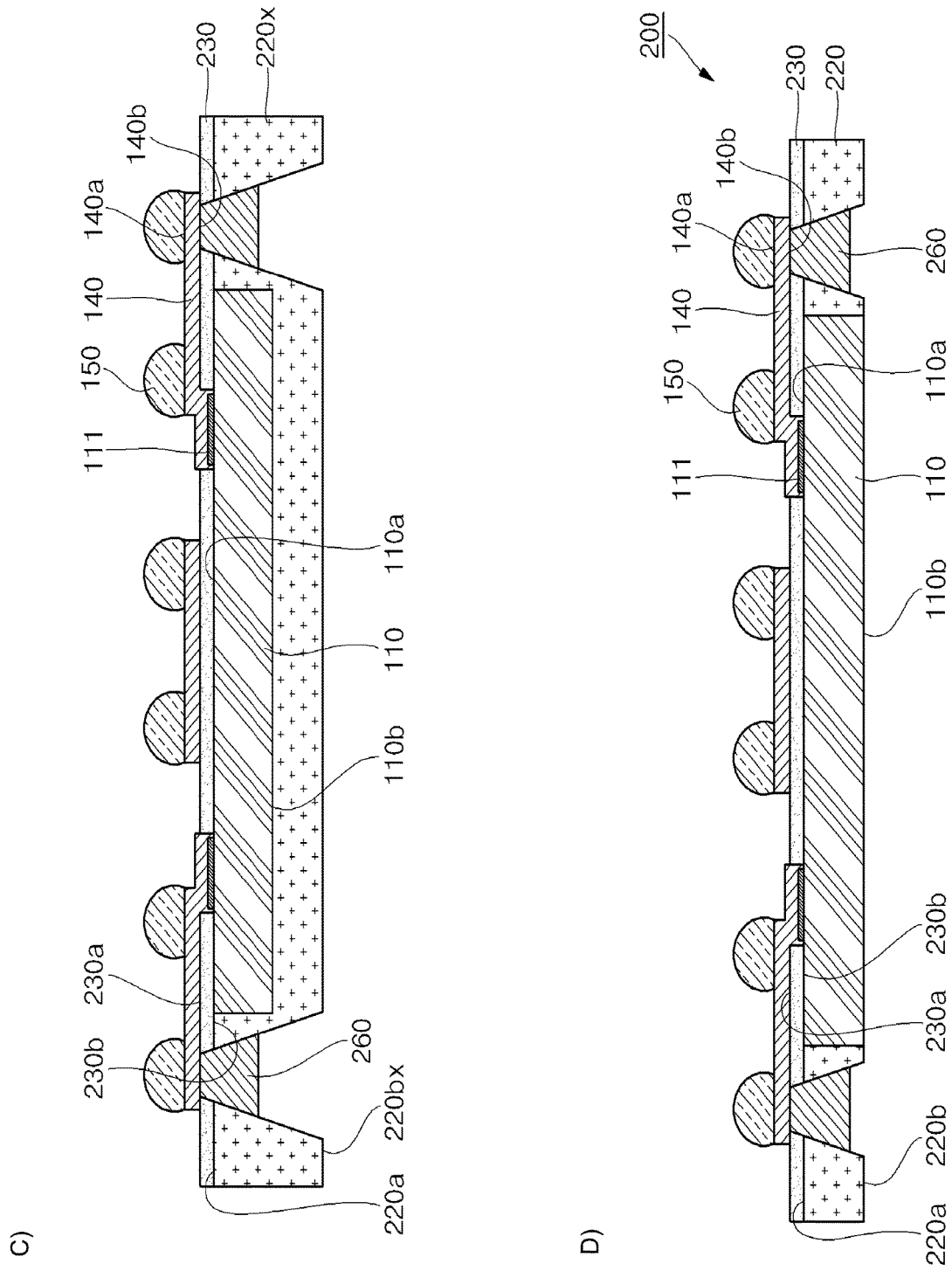

Referring to FIG. 7C, a cross-sectional view illustrating the step of forming a conductive bump (S11) in the manufacturing method of the semiconductor device 200 is illustrated. In the forming of the conductive bump step (S11), a conductive bump 150 may be formed on the first surface 140a of the redistribution layer 140. The conductive bump 150 may be electrically connected to the redistribution layer 140. The conductive bump 150 may be electrically connected to the semiconductor die 110 through the redistribution layer 140 and the bond pads 111.

Referring to FIG. 7D, a cross-sectional view illustrating the step of back grinding (S12) in the manufacturing method of the semiconductor device 200 is illustrated. In the back grinding step (S12), the first encapsulant 220x may be thinned to expose the second surface 110b of the semiconductor die 110 encapsulated by the first encapsulant 220x. That is to say, in the back grinding step (S12), the second surface 220bx of the first encapsulant 220x may be subjected to grinding to expose the second surface 110b of the semiconductor die 110, thereby allowing only side portions of the semiconductor die 110 to be encapsulated by the first encapsulant 220. Here, the first surface 110a of the semiconductor die 110 and the first surface 120a of the first encapsulant 220 may be coplanar with respect to each other, and the second surface 110b of the semiconductor die 110 and the second surface 120b of the first encapsulant 220 may be coplanar with respect to each other.

Figure 8:
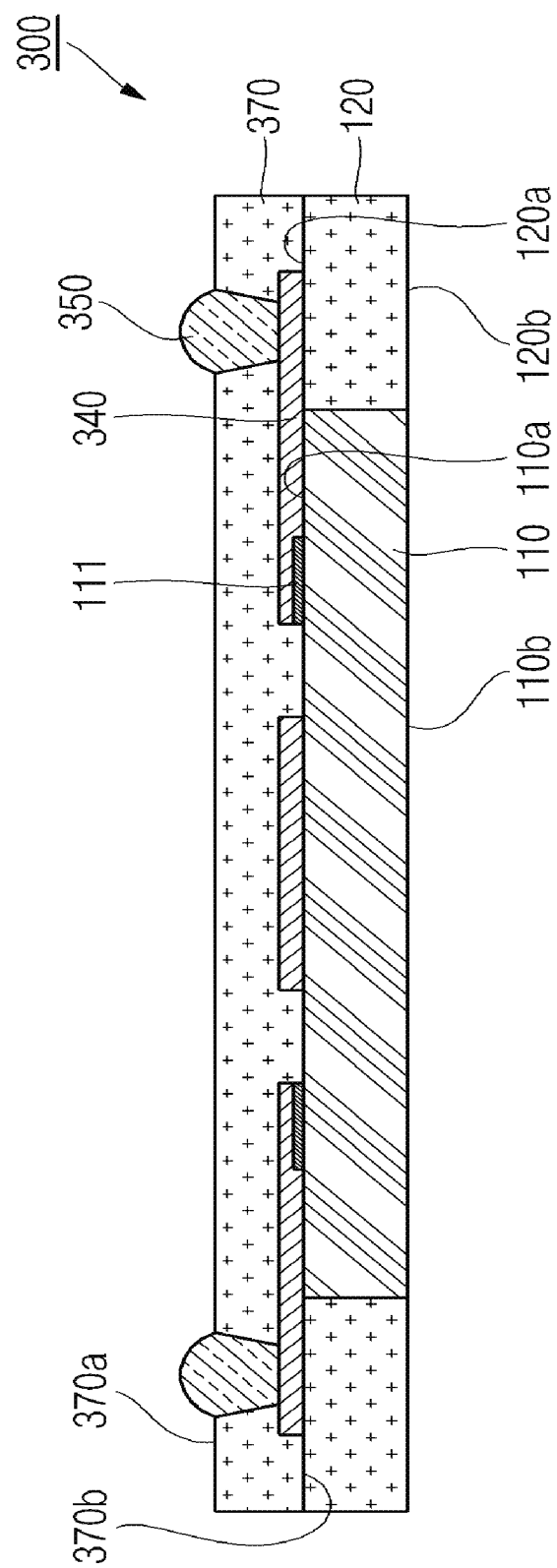
FIG. 8 is a cross-sectional view of a semiconductor device according to still another embodiment of the present disclosure.

Referring to FIG. 8, a cross-sectional view of a semiconductor device according to still another embodiment of the present disclosure is illustrated.

As illustrated in FIG. 8, the semiconductor device 300 comprises a semiconductor die 110 having a plurality of bond pads 111 formed thereon, a first encapsulant 120 encapsulating side portions of the semiconductor die 110, at least one redistribution layer 340 formed on the semiconductor die 100 and the first encapsulant 120, a second encapsulant 370 formed on the redistribution layer 340 and exposing a portion of the redistribution layer 340 to the outside, and a conductive bump 350 connected to the redistribution layer 340 exposed to the outside through the second encapsulant 370. The semiconductor die 110 and the first encapsulant 120 of the semiconductor device 300 may be substantially similar to corresponding components of the semiconductor device 100 shown in FIG. 1. Therefore, the following description will focus on the redistribution layer 340, the second encapsulant 370 and the conductive bump 350 of the semiconductor device 300, which may be different from the corresponding components of the semiconductor device 100 shown in FIG. 1.

The redistribution layer 340 may be formed on the first surface 110a of the semiconductor die 110 to then be brought into contact with the plurality of bond pads 111. The redistribution layer 340 may be connected to the plurality of bond pads 111 to then be electrically connected. The redistribution layer 340 may have various patterns so as to make contact with each of the plurality of bond pads 111 and one or more redistribution layers 140 may be provided. The one or more redistribution layers 340 may extend to the first surface 120a of the first encapsulant 120. That is to say, the redistribution layers 340 may be formed on the first surface 110a of the semiconductor die 110 and at least one of the redistribution layers 340 may extend from the first surface 110a of the semiconductor die 110 to the first surface 120a of the first encapsulant 120. The redistribution layer 340 may be formed to have patterns on the semiconductor die 110 and the first encapsulant 120 by silk screen printing. The redistribution layer 340 may be covered by the second encapsulant 370 and may be electrically connected to the conductive bump 350.

The second encapsulant 370 may be formed on the first surface 110a of the semiconductor die 110, the first surface 120a of the first encapsulant 120 and the redistribution layer 340. The second encapsulant 370 may comprise a first surface 370a and a second surface 370b opposite to the first surface 370a and making contact with the first surface 110a of the semiconductor die 110, the first surface 120a of the first encapsulant 120 and the redistribution layer 340. A through-via may be formed in the second encapsulant 370 to pass through between the first surface 370a and the second surface 370b, and the conductive bump 350 may be formed in the through-via to fill the through-via. The second encapsulant 370 may comprise the same or similar material with the first encapsulant 120, but aspects of the present disclosure are not limited thereto.

The conductive bump 350 may be formed to pass through the first surface 370a and the second surface 370b of the second encapsulant 370. The conductive bump 350 may be connected to the redistribution layer 340 formed on the first surface 110a of the semiconductor die 110 and the first surface 120a of the first encapsulant 120. The conductive bump 350 may be electrically connected to the semiconductor die 110 through the redistribution layer 340. The conductive bump 350 may be shaped to outwardly protrude more than the first surface 370a of the second encapsulant 370. The conductive bump 350 may be a solder bump, and may comprise a material selected from a eutectic solder (e.g., Sn37Pb), a high lead solder (e.g., Sn95Pb), a lead-free solder (e.g., SnAg, SnAu, SnCu, SnZn, SnZnBi, SnAgCu, SnAgBi, etc.), but not limited thereto.

Since the semiconductor device 300 may be formed without using a photolithography process, the manufacturing process can be simplified and the manufacturing cost may be reduced.

Figure 9:
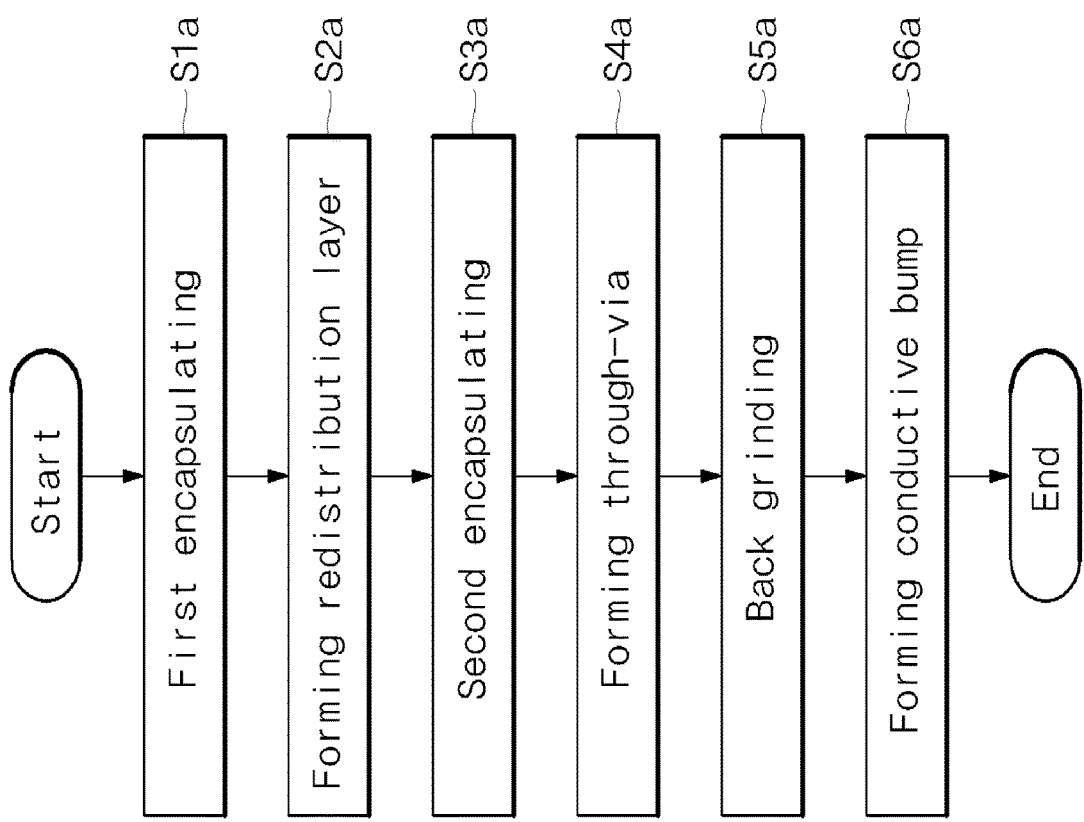
FIG. 9 is a flowchart illustrating a manufacturing method of the semiconductor device shown in FIG. 8.

Referring to FIG. 9, a flowchart illustrating a manufacturing method of the semiconductor device shown in FIG. 8 is illustrated. As illustrated in FIG. 9, the manufacturing method of the semiconductor device includes first encapsulating (S1a), forming a redistribution layer (S2a), second encapsulating (S3a), forming a through-via (S4a), back grinding (S5a) and forming a conductive bump (S6a).

The manufacturing method of the semiconductor device 300 will now be described in more detail with reference to FIGS. 10A to 10F.

Figures 10A, 10B:
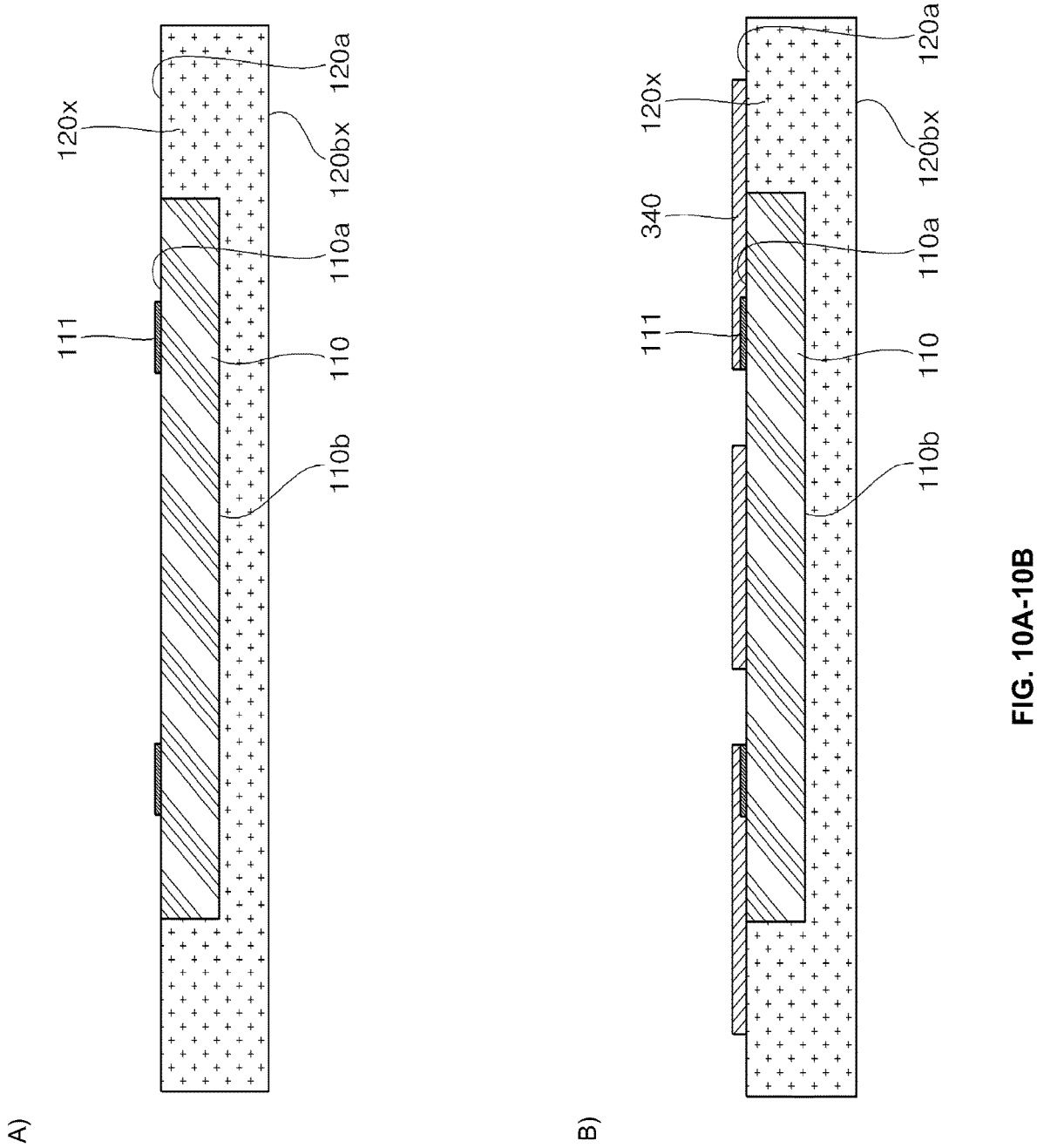
FIGS. 10A to 10F are cross-sectional views illustrating a manufacturing method of the semiconductor device shown in FIG. 9.

Referring to FIG. 10A, a cross-sectional view illustrating the step of first encapsulating (S1a) in the manufacturing method of the semiconductor device 300 is illustrated. In the first encapsulating step (S1a), the first encapsulant 120x may be formed to encapsulate the second surface 110b of the semiconductor die 110 and a side surface connecting the first surface 110a and the second surface 110b of the semiconductor die 110. Here, the first surface 110a of the semiconductor die 110 and the first surface 120a of the first encapsulant 120x may be coplanar with respect to each other. In subsequent processing steps, the first encapsulant 120x may protect the second surface 110b and side portions of the semiconductor die 110 from the external environment. The first encapsulant 120x may serve as a carrier for fixing the semiconductor die 110 when transferred to equipment for each process and preventing the semiconductor die 110 from being damaged in the subsequent processes.

Referring to FIG. 10B, a cross-sectional view illustrating the step of forming the redistribution layer (S2a) in the manufacturing method of the semiconductor device 300 is illustrated. In the forming the redistribution layer step (S2a), the redistribution layer 340 may be formed on the first surface 110a of the semiconductor die 110 and the first surface 120a of the first encapsulant 120 to be brought into contact with the plurality of bond pads 111 formed on the first surface 110a of the semiconductor die 110. The redistribution layer 340 may be electrically connected to the plurality of bond pads 111 of the semiconductor die 110. The redistribution layer 340 may have various patterns so as to make contact with each of the plurality of bond pads 111 and one or more redistribution layers 140 may be provided. The at least one redistribution layer 340 may extend to the first surface 110a of the first encapsulant 120.

Figures 10C, 10D:
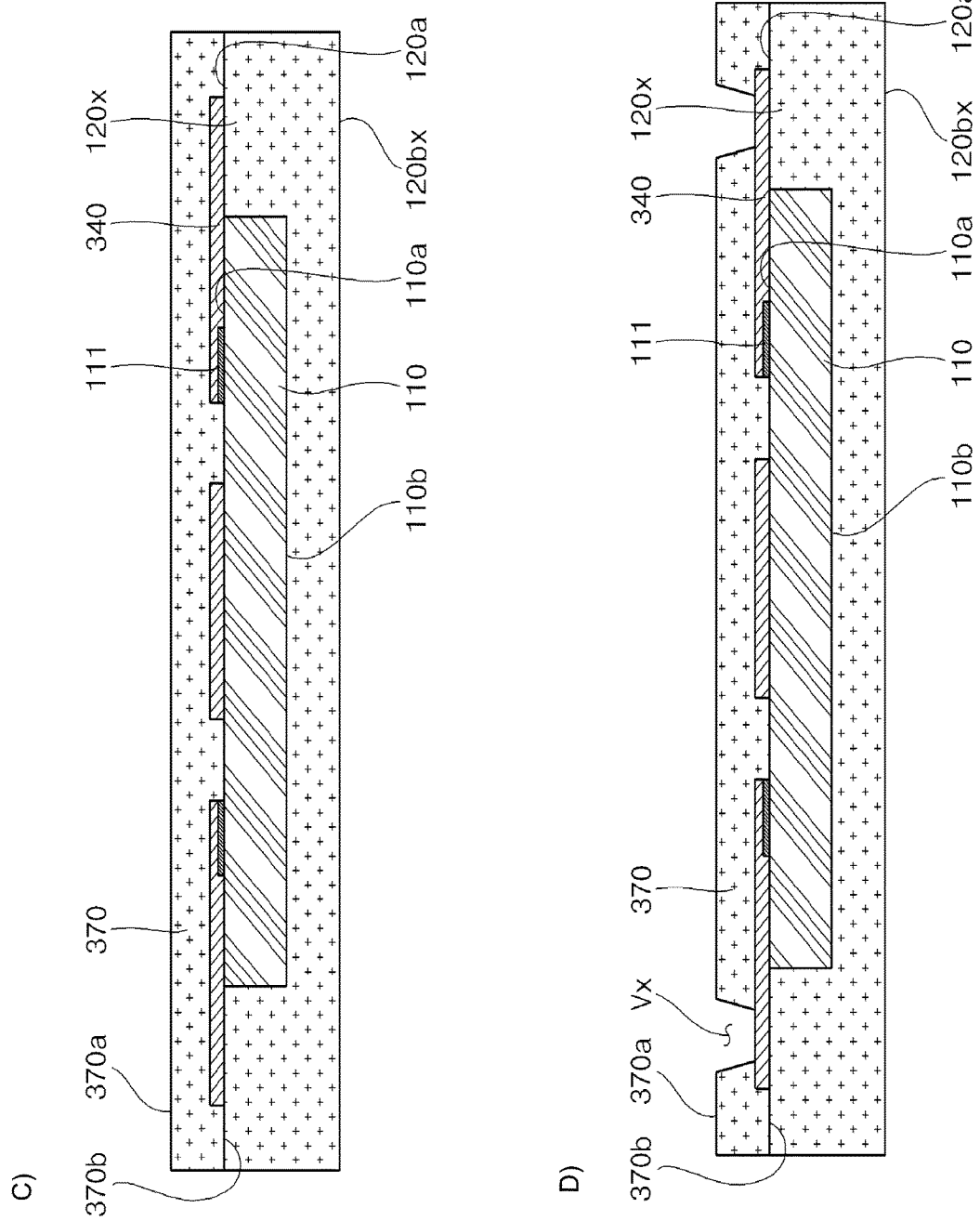

Referring to FIG. 10C, a cross-sectional view illustrating the step of second encapsulating (S3a) in the manufacturing method of the semiconductor device 300 is illustrated. In the second encapsulating step (S3a), the second encapsulant 370 may be formed to cover all of the first surface 110a of the semiconductor die 110, the first surface 120a of the first encapsulant 120 and the redistribution layer 340. The second encapsulant 370 may comprise a first surface 370a and a second surface 370b opposite to the first surface 370a and making contact with the first surface 110a of the semiconductor die 110, the first surface 120a of the first encapsulant 120 and the redistribution layer 340.

Referring to FIG. 10D, a cross-sectional view illustrating the step of forming a through-via (S4a) in the manufacturing method of the semiconductor device 300 is illustrated. In the forming of the through-via step (S4a), a through-via (Vx) passing through between the first surface 370a and the second surface 370b of the second encapsulant 370 is formed to expose the redistribution layer 340 to the outside. The redistribution layer 340 exposed to the outside through the through-via (Vx) may be formed on the first surface 120a of the first encapsulant 120. That is to say, the redistribution layer 340 formed on the first surface 120a of the first encapsulant 120 may be exposed to the outside through the through-via (Vx) formed on the second encapsulant 370.

Figures 10E, 10F:
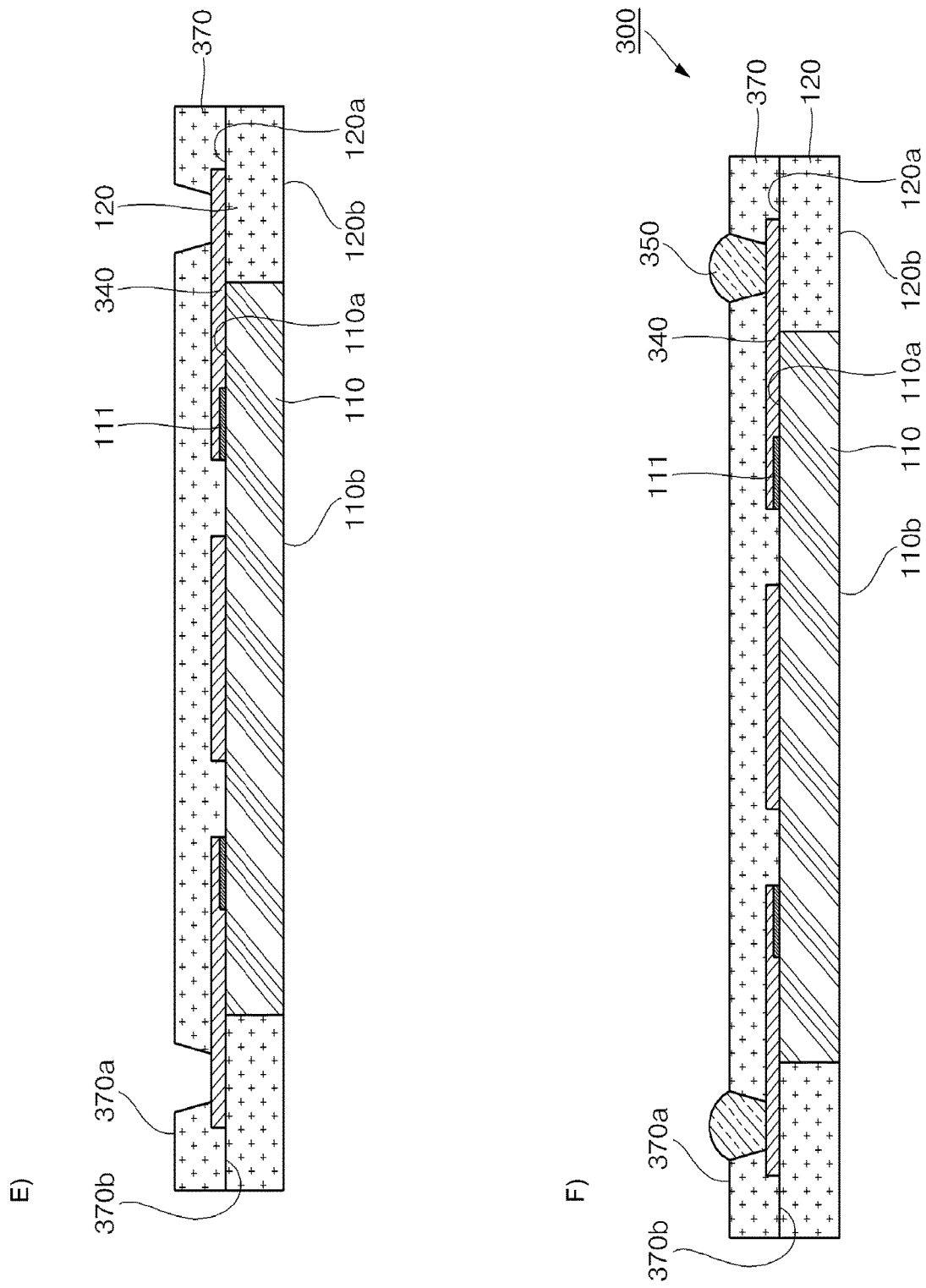

Referring to FIG. 10E, a cross-sectional view illustrating the step of back grinding (S5a) in the manufacturing method of the semiconductor device 300 is illustrated. In the back grinding step (S5a), the first encapsulant 120x may be thinned to expose the second surface 110b of the semiconductor die 110 encapsulated by the first encapsulant 120x to the outside. That is to say, in the back grinding step (S5a), a second surface 120bx of the first encapsulant 120x may be subjected to grinding to expose the second surface 110b of the semiconductor die 110, thereby allowing only side portions of the semiconductor die 110 to be encapsulated by the first encapsulant 120. Here, the second surface 110b of the semiconductor die 110 and the second surface 120b of the first encapsulant 120 may be coplanar with respect to each other.

Referring to FIG. 10F, a cross-sectional view illustrating the step of forming a conductive bump (S6a) in the manufacturing method of the semiconductor device 300 is illustrated. In the forming of the conductive bump step (S6a), the conductive bump 350 may be formed to fill the through-via (Vx) formed on the redistribution layer 340. The conductive bump 350 may be formed to make contact with the redistribution layer 340 exposed to the outside in the forming of the through-via step (S4a). In addition, the conductive bump 350 may be shaped to outwardly protrude beyond the first surface 370a of the second encapsulant 370. The conductive bump 350 may be electrically connected to the redistribution layer 340. That is to say, the conductive bump 350 may be electrically connected to the semiconductor die 110 through the redistribution layer 340 and the bond pads 111.

This disclosure provides example embodiments supporting the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure.

In an example embodiment of the disclosure a method is disclosed for providing a carrier with a non-photosensitive protection layer, forming a pattern in the non-photosensitive protection layer, providing a semiconductor die with a contact pad on a first surface, and bonding the semiconductor die to the non-photosensitive protection layer such that the contact pad aligns with the pattern formed in the non-photosensitive protection layer. A second surface opposite to the first surface of the semiconductor die, side surfaces between the first and second surfaces of the semiconductor die, and a portion of a first surface of the non-photosensitive protection layer may be encapsulated with an encapsulant. The carrier may be removed leaving the non-photosensitive protection layer bonded to the semiconductor die. A redistribution layer may be formed on the contact pad and a second surface of the non-photosensitive protection layer opposite to the first surface. A conductive bump may be formed on the redistribution layer. The encapsulant may be thinned such that the second surface of the semiconductor die is coplanar with the encapsulant. A through via may be formed from the redistribution layer through the non-photosensitive protection layer and the encapsulant. At least a portion of the through via may be filled with conductive material. The non-photosensitive protective layer may be patterned utilizing a laser.

In another embodiment of the disclosure, a device is disclosed comprising a semiconductor die having a first surface, a second surface opposite to the first surface, and side surfaces between the first and second surfaces. An encapsulant may encapsulate the side surfaces of the semiconductor die. A non-photosensitive protection layer may cover a portion of the first surface of the semiconductor die and a first surface of the encapsulant. A contact pad may be on the first surface of the semiconductor die, and a redistribution layer may be on the non-photosensitive protection layer and the contact pad. The second surface of the semiconductor die may be coplanar with a surface of the encapsulant. A through via may extend from the redistribution layer through the non-photosensitive protection layer and the encapsulant. The through via may be at least partially filled with conductive material. The redistribution layer may comprise a linear portion and a circular pad. A hemispherical conductive bump on the circular pad may comprise a protruding part extending toward the linear portion and has a radius less than the hemispherical conductive bump.

The present disclosure provides a semiconductor device and a manufacturing method thereof, which uses a non-photosensitive protection layer that can be patterned by laser or which removes an unnecessary protection layer, thereby preventing the yield from being lowered or the cost from increasing due to a photolithography process.

In one aspect, the present disclosure provides a semiconductor device including a semiconductor die having a plurality of bond pads formed on its first surface, a first encapsulant formed to encapsulate side portions of the semiconductor die, a non-photosensitive protection layer formed on the first surface of the semiconductor die and the first encapsulant to expose the plurality of bond pads, at least one redistribution layer formed on the non-photosensitive protection layer to be electrically connected to the exposed plurality of bond pads, and a conductive bump connected to the at least one redistribution layer.

The first encapsulant may include a first surface coplanar with the first surface of the semiconductor die and a second surface opposite to the first surface. The semiconductor device may further include a conductive connection member passing through between the second surface of the first encapsulant and the first surface. The conductive connection member may pass through the non-photosensitive protection layer formed on the first surface of the first encapsulant to then be connected to the redistribution layer.

The conductive bump may include a protruding part protruding to one side along the redistribution layer and shaped of a hemisphere in which its one planar surface is connected to the redistribution layer.

In another aspect, the present disclosure provides semiconductor device including semiconductor die having a plurality of bond pads formed on its first surface, a first encapsulant formed to encapsulate side portions of the semiconductor die, at least one redistribution layer formed on the first surface of the semiconductor die to be electrically connected to the plurality of bond pads, a second encapsulant formed on the first surface of the semiconductor die, the first encapsulant and the at least one redistribution layer to expose a portion of the at least one redistribution layer, and a conductive bump connected to the at least one redistribution layer exposed to the outside through the second encapsulant.

The at least one redistribution layer may be formed by silk screen printing. In another aspect, the present disclosure provides a manufacturing method of a semiconductor device, including preparing a carrier having a non-photosensitive protection layer formed therein, forming a pattern on the non-photosensitive protection layer using laser to expose a portion of the carrier, attaching a semiconductor die to the non-photosensitive protection layer to allow the exposed carrier and a plurality of bond pads provided on the first surface of the semiconductor die to face each other, first encapsulating for forming a first encapsulant to cover both of the semiconductor die and the non-photosensitive protection layer, removing the carrier from the non-photosensitive protection layer to expose the plurality of bond pads to the outside, and forming at least one redistribution layer on the non-photosensitive protection layer to be electrically connected to the plurality of bond pads exposed to the outside.

After the forming of the at least one redistribution layer, the manufacturing method may further include forming a conductive bump on the at least one redistribution layer, and back grinding the first encapsulant to expose a second surface opposite to the first surface of the semiconductor die to the outside.

After the forming of the at least one redistribution layer, the manufacturing method may further include forming a through-via passing through the first encapsulant and the non-photosensitive protection layer to allow the at least one redistribution layer to be exposed to the outside, and forming a conductive connection member in the through-via to be electrically connected to the redistribution layer.

In the forming of the through-via, the through-via may be formed by a laser drill so as to pass through the first encapsulant and the non-photosensitive protection layer. After the forming of the conductive connection member, the manufacturing method may further include forming a conductive bump on the at least one redistribution layer, and first grinding the first encapsulant to expose a second surface opposite to the first surface of the semiconductor die to the outside.

In still another aspect, the present disclosure provides a manufacturing method of a semiconductor device, including first encapsulating for forming a first encapsulant on a first surface of a semiconductor die having a plurality of bond pads formed thereon to cover both of a second surface opposite to the first surface and a side surface of the semiconductor die, forming at least one redistribution layer on the first surface of the semiconductor die by silk screen printing to be electrically connected to the plurality of bond pads, second encapsulating for forming a second encapsulant to cover both of the first surface of the semiconductor die and the redistribution layer, forming a through-via passing through the second encapsulant to allow the at least one redistribution layer to be exposed to the outside, and forming a conductive bump in the through-via to be electrically connected to the redistribution layer.

After the forming of the through-via, the manufacturing method may further include back grinding the first encapsulant to expose the second surface of the semiconductor die to the outside. In the forming of the through-via, the through-via may be formed by a laser drill so as to pass through the second encapsulant. As described above, in the semiconductor device and manufacturing method thereof, a non-photosensitive protection layer that can be patterned by laser is used or an unnecessary protection layer is removed, thereby preventing the yield from being lowered or the cost from increasing due to a photolithography process.

While various aspects of the present disclosure have been described with reference to certain supporting embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A semiconductor device, comprising:
   a semiconductor die comprising a first surface, a second surface opposite the first surface, a contact pad on the first surface, and a side surface between the first surface and the second surface;
   a first encapsulant comprising a first surface and a second surface opposite the first surface, the first encapsulant encapsulating the side surface of the semiconductor die;
   a redistribution structure that comprises a conductive layer that is coupled to the contact pad, the conductive layer comprising a contact portion that extends over the first surface of the first encapsulant; and
   a second encapsulant comprising a single layer of electrically insulating material, wherein the single layer of electrically insulating material comprises a first surface and a second surface opposite the first surface, and wherein the second surface of the single layer of electrically insulating material covers the first surface of the semiconductor die, the redistribution structure, and the first surface of the first encapsulant and contacts the conductive layer of the redistribution structure.

2. The semiconductor device of claim 1, further comprising:
   a via that extends through a first surface of the second encapsulant to the contact portion of the conductive layer; and
   a conductive bump in the via, the conductive bump coupled to the contact portion and protruding beyond the first surface of the second encapsulant.

3. The semiconductor device of claim 2, wherein the conductive bump directly contacts the contact portion of the conductive layer.

4. The semiconductor device of claim 1, wherein the second surface of the second encapsulant directly contacts the first surface of the first encapsulant.

5. The semiconductor device of claim 1, wherein the second surface of the second encapsulant directly contacts the first surface of the semiconductor die.

6. The semiconductor device of claim 1, wherein the second surface of the semiconductor die and the second surface of the first encapsulant are coplanar.

7. The semiconductor device of claim 1, wherein the first surface of the semiconductor die and the first surface of the first encapsulant are coplanar.

8. The semiconductor device of claim 1, wherein the first and second encapsulants comprise a same encapsulant material.

9. A semiconductor device, comprising:
   a semiconductor die comprising a first surface, a second surface opposite the first surface, a contact pad on the first surface, and a side surface between the first surface and the second surface;
   a redistribution structure that is coupled to the contact pad, the redistribution structure comprising a contact portion that extends beyond the side surface of the semiconductor die;
   a single encapsulating material that encapsulates the first surface of the semiconductor die, the side surface of the semiconductor die, and the redistribution structure, wherein the single encapsulating material directly contacts the first surface of the semiconductor die; and
   a conductive bump coupled to the contact portion, contacting the single encapsulating material, and protruding beyond an outer surface of the single encapsulating material.

10. The semiconductor device of claim 9, wherein the conductive bump directly contacts the contact portion of the redistribution structure.

11. The semiconductor device of claim 9, wherein a redistribution layer of the redistribution structure directly contacts the contact pad of the semiconductor die.

12. The semiconductor device of claim 9, wherein the single encapsulating material directly contacts the redistribution structure.

13. The semiconductor device of claim 9, wherein the encapsulating material is provided by a plurality of layers of the single encapsulating material.

14. A semiconductor device, comprising:
   a semiconductor die comprising a first surface, a second surface opposite the first surface, a contact pad on the first surface, and a side surface between the first surface and the second surface;
   a first encapsulant comprising a first surface and a second surface opposite the first surface, the first encapsulant encapsulating the side surface of the semiconductor die;
   a redistribution structure comprising one or more conductive redistribution layers wherein a first conductive redistribution layer of the one or more conductive redistribution layers extends from the contact pad to a contact portion beyond the side surface of the semiconductor die;
   a second encapsulant comprising an epoxy-based resin, wherein the epoxy-based resin covers the first surface of the semiconductor die and the redistribution structure, wherein the second encapsulant provides a via aligned with the contact portion of the first conductive redistribution layer; and
   a conductive bump coupled to the contact portion through the via provided by the second encapsulant and protruding beyond an outer surface of the second encapsulant.

15. The semiconductor device of claim 14, wherein the conductive bump directly contacts the contact portion of the first conductive redistribution layer.

16. The semiconductor device of claim 14, wherein the first conductive redistribution layer directly contacts the contact pad of the semiconductor die.

17. The semiconductor device of claim 14, wherein the second encapsulant directly contacts the first surface of the semiconductor die.

18. The semiconductor device of claim 14, wherein the first encapsulant and the second encapsulant directly contact the redistribution structure.

19. The semiconductor device of claim 14, wherein the first encapsulant encapsulates the second surface of the semiconductor die.

* * * * *